United States Patent [19]
Yamazaki

[11] Patent Number: 4,597,161
[45] Date of Patent: Jul. 1, 1986

[54] METHOD OF MAKING PHOTOELECTRIC CONVERSION DEVICE

[75] Inventor: Shunpei Yamazaki, Tokyo, Japan

[73] Assignee: Semiconductor Energy Laboratory Co., Ltd., Tokyo, Japan

[21] Appl. No.: 722,006

[22] Filed: Apr. 11, 1985

Related U.S. Application Data

[62] Division of Ser. No. 605,663, Apr. 30, 1984.

[30] Foreign Application Priority Data

Apr. 29, 1983 [JP] Japan .................. 58-75713

[51] Int. Cl.$^4$ ...................... H01L 27/14; H01L 31/18
[52] U.S. Cl. ..................... 29/572; 136/244; 136/258; 156/643; 219/121 LH; 29/583; 29/591
[58] Field of Search .................. 29/572, 583, 591; 136/244, 249 MS, 258 AM; 427/74; 357/30; 219/121 LH; 156/643

[56] References Cited

U.S. PATENT DOCUMENTS

| | | | |
|---|---|---|---|
| 4,292,092 | 9/1981 | Hanak | 148/1.5 |
| 4,315,096 | 2/1982 | Tyan et al. | 136/244 |
| 4,334,120 | 6/1982 | Yamano et al. | 136/248 |

*Primary Examiner*—Aaron Weisstuch
*Attorney, Agent, or Firm*—Gerald J. Ferguson, Jr.

[57] ABSTRACT

A photoelectric conversion device in which a plurality n (n being an integer larger than one) of semiconductor elements $U_1$ to $U_n$ are sequentially formed on a substrate in a side-by-side relation and connected in series one after another. The substrate is formed by an insulating sheet-like member having an insulating film formed on a flexible metallic sheet-like member. The element $U_i$ (i=1, 2, ... n) has a first electrode $E_i$, a non-single-crystal semiconductor laminate member $Q_i$ formed on the first electrode $E_i$ and having formed therein at least one PN or PIN junction, and a second electrode $F_i$ formed on the semiconductor laminate member $Q_i$. The element $U_i$ is formed by the following process: (a) a first conductive layer which will ultimately serve as the first electrode $E_i$ is formed on the substrate and then subjected to a first laser beam scanning, (b) a non-single-crystal semiconductor laminate member which will ultimately serve as the semiconductor laminate member $Q_i$ is formed to cover the first electrode $E_i$ and then subjected to a second laser beam scanning, (c) a second conductive layer which will ultimately serve as a second electrode $F_i$ is formed on the semiconductor laminate member $Q_i$ and then subjected to a third laser beam scanning.

18 Claims, 28 Drawing Figures

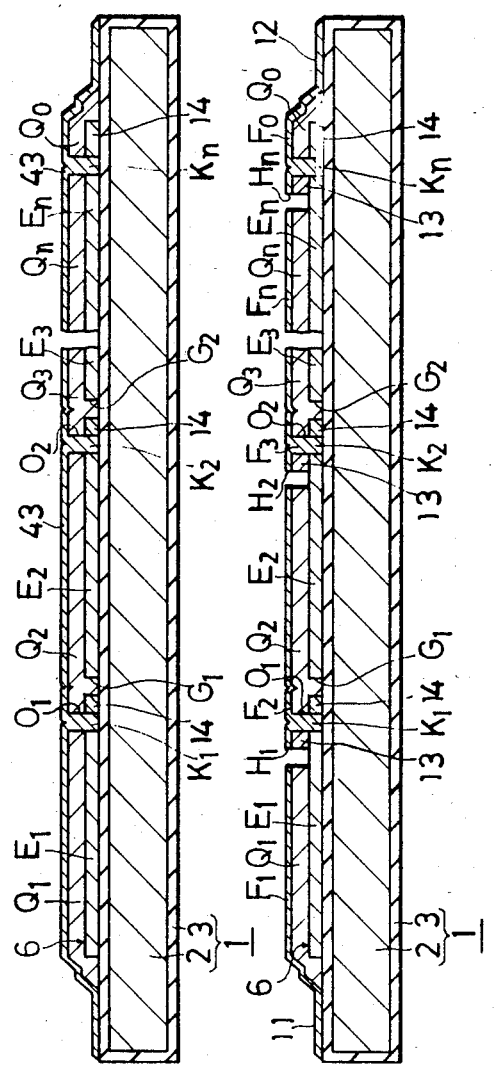

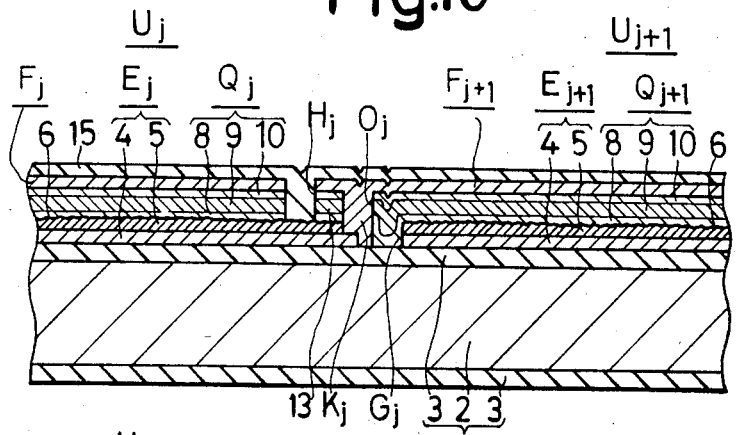
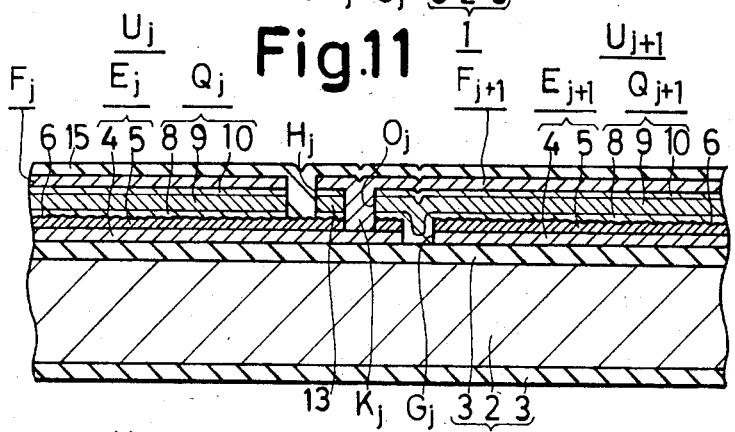
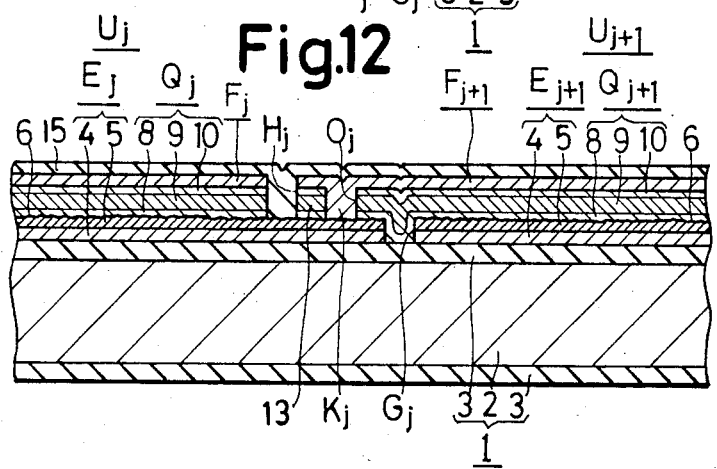

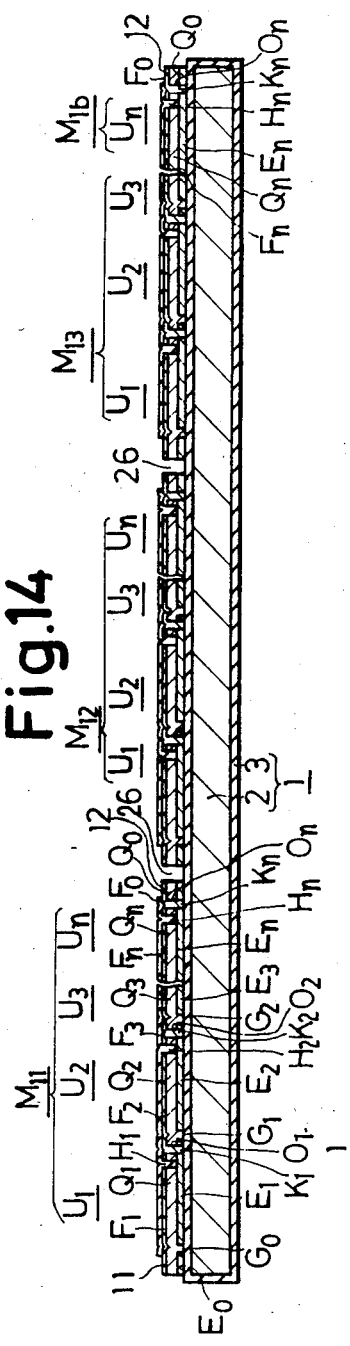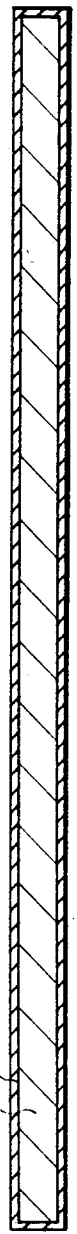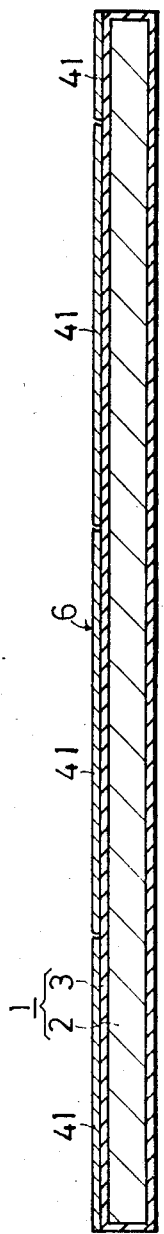
Fig.14
Fig.15A
Fig.15B

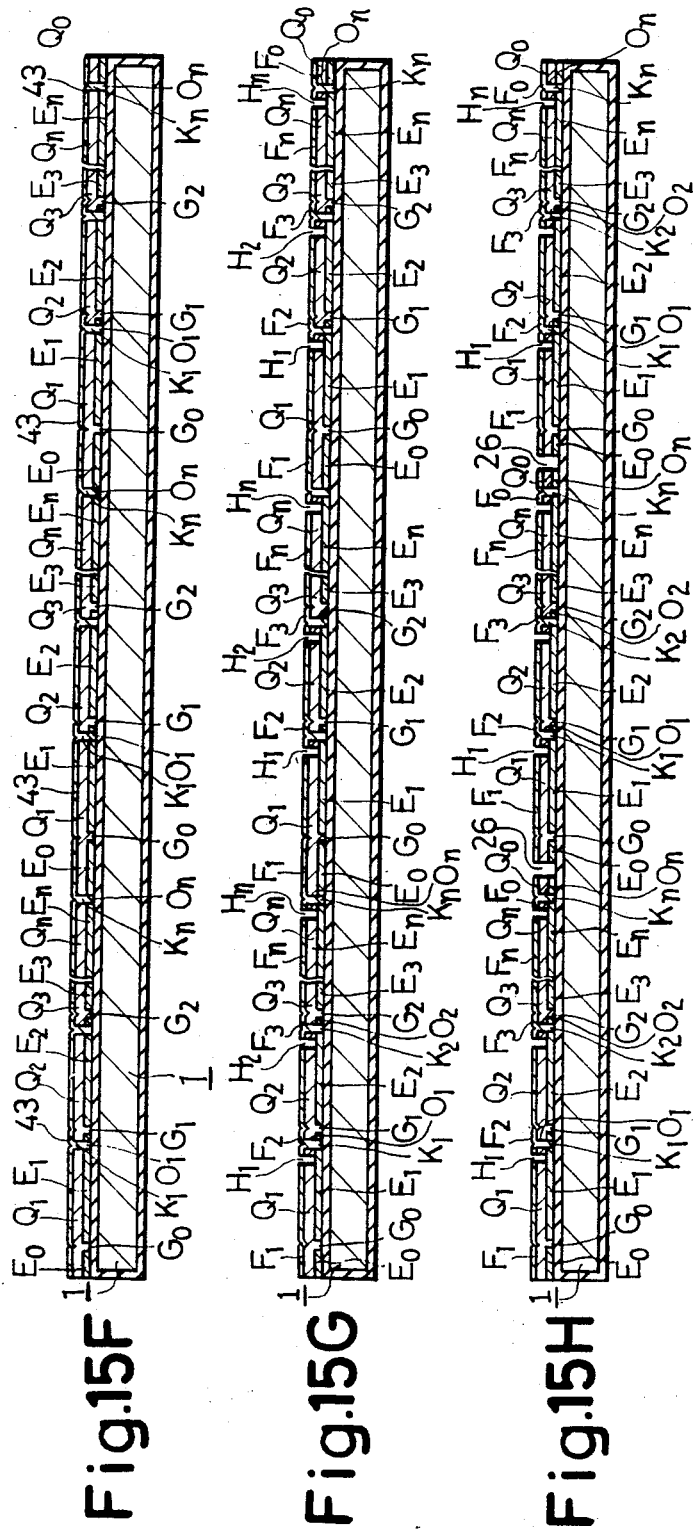

METHOD OF MAKING PHOTOELECTRIC CONVERSION DEVICE

This is a divisional application of Ser. No. 605,663, filed Apr. 30, 1984.

BACKGROUND OF THE INVENTION

1. Field of the Invention

The present invention relates to improvement in or relating to a photoelectric conversion device in which a number of semiconductor elements are sequentially arranged on a substrate in side-by-side relation and connected in series.

The invention also pertains to a method for the manufacture of such a photoelectric conversion device.

2. Description of the Prior Art

A wide variety of photoelectric conversion devices have been proposed which are of the type wherein a number of semiconductor elements are formed side by side on a substrate in a sequential order.

Some of the conventional photoelectric conversion devices employ a plate-like member of glass or ceramics as the substrate; in this case, since the substrate is brittle, much care is necessary in handling the photoelectric conversion devices. Moreover, since the glass or ceramic substrate is inflexible, difficulty is encountered in mounting the photoelectric conversion device on a light receiving panel.

Sometimes the substrate is formed by a plate-like member of synthetic resin or metal; such a substrate is not readily broken and can be made flexible by reducing its thickness.

However, a substrate made of a thin plate-like member of synthetic resin, when pulled, tends to elongate as compared with a substrate formed by a thin plate-like member of metal. This introduces the possibility that elongation of the substrate caused, for example, when mounting the photoelectric conversion device on a light receiving panel, imposes a mechanical strain on the semiconductor elements sufficient to deteriorate their characteristics or break them down, making it impossible for the photoelectric conversion device to attain its required photoelectric conversion efficiency or perform its normal operation.

The substrate of synthetic resin is apt to be degenerated by light which impinges it during irradiation of the photoelectric conversion device. The degeneration of the substrate resulting from long-time service of the photoelectric conversion device often distorts the substrate itself or makes it pervious to air or water. The distortion of the substrate imposes a mechanical strain on the semiconductor elements formed thereon, resulting in degradation of their characteristics, as mentioned above. When the substrate becomes pervious to air or water, water or undesirable components pass through the substrate to reach the semiconductor elements to adversely affect them.

Accordingly, the photoelectric conversion device using a substrate of synthetic resin, when used for a long period of time, may become unable to provide the required photoelectric conversion efficiency or to stand further use.

Furthermore, the substrate of synthetic resin is readily degenerated by heat applied from the outside or generated in the semiconductor elements while in use. This also distorts the substrate or makes it pervious to air or water, cutting down the photoelectric conversion efficiency of the device or putting it out of order.

Besides, the substrate of synthetic resin is lower in heat resistance than the metallic substrate, and hence it is likely to be degenerated or deformed by heat applied for forming the semiconductor elements on the substrate. Accordingly, the use of the substrate of synthetic resin introduces difficulty in the manufacture of the photoelectric conversion device.

When the substrate is formed by a thin plate-like member of metal, there are no such defects as mentioned above. In this case, however, since the substrate surface is conductive, a relatively thick insulating layer must be interposed between the substrate and the semiconductor elements. This impairs the flexibility of the photoelectric conversion device and calls for additional steps of forming the insulating layer on the substrate prior to the formation thereon of the semiconductor elements, thus introducing complexity in the fabrication of the device by that.

There are times when the semiconductor elements on the substrate are each formed of a single-crystal semiconductor laminate member. In such a case, even slight bending of the photoelectric conversion device may impose a strain on the single-crystal semiconductor laminate member to degrade the characteristics of the semiconductor elements, resulting in the photoelectric conversion device becoming poor in its characteristics or being put out of order.

In addition, since the single-crystal semiconductor laminate member is difficult to form at low cost and with ease, its use is not preferable for the fabrication of the photoelectric conversion device.

In some of the conventional photoelectric conversion devices, the semiconductor photo elements are electrically connected in series one after another. In this case, the semiconductor elements are usually connected through the use of electrical connecting means formed by conductive layers or leads provided separately of their electrodes. But the electrical connecting means occupy a significantly large area of the substrate relative to the area occupied by the semiconductor elements on the substrate. In other words, the number of semiconductor elements formed on the substrate per unit area is small and, consequently, the photovoltage per unit area of the substrate is low. Furthermore, the electrical connecting means is required, thus introducing complexity in the manufacture of the photoelectric conversion device.

In the fabrication of the photoelectric conversion device, the semiconductor elements are usually formed by a method including the following steps (a) to (c):

(a) A first conductive layer which will ultimately act as a first electrode of each semiconductor element is formed on the substrate, a first mask of a predetermined pattern is formed (by an ordinary printing method) on the first conductive layer and then the first conductive layer is selectively etched away through the first mask, thereby providing the first electrode of each semiconductor element.

(b) A semiconductor laminate member which will ultimately serve as a semiconductor laminate member of each semiconductor element having formed thereon a PN or PIN junction is formed on the substrate in such a manner that the first electrodes of the semiconductor elements, formed by the step (a), may be buried in the semiconductor laminate member, a second mask of a predetermined pattern is formed on the semiconductor laminate member and then the semiconductor laminate member is selectively etched away through the second mask, thereby providing the semiconductor laminate member of each semiconductor element.

(c) A second conductive layer which will ultimately serve as a second electrode of each semiconductor element is formed on the substrate in such a manner that the semiconductor laminate members of the semiconductor elements, formed by the second step (b), may be buried in the second condutive layers, a third mask of a predetermined pattern is formed on the second conductive layer and then the second conductive layer is selectively etched away through the third mask, thereby providing the second electrode of each semiconductor element.

According to the conventional method including the abovesaid steps (a) to (c), the formation of the many semiconductor elements calls for three etching steps using masks, i.e. the first electrode forming step including the formation of the first mask and the selective etching through using the first mask, the semiconductor laminate member forming step including the formation of the second mask and the selective etching through using the second mask and the second electrode forming step including the formation of the third mask and the selective etching using the third mask. Accordingly, the prior art method has the defect of involving many steps for the manufacture of the photoelectric conversion device.

According to the conventional manufacturing method, the etching masks must be formed accurately in position but the positioning is very difficult, which is a serious obstacle to the fabrication of the photoelectric conversion device.

Furthermore, there is a certain limit to forming the etching masks in predetermined patterns with high precision. This imposes severe limitations on the number of semiconductor elements per unit area of the substrate and consequently the photovoltage per unit area of the substrate.

Moreover, according to the prior art manufacturing method, the semiconductor elements are usually electrically connected in series through the use of electrical connecting means formed by conductive layers or leads provided separately of the first and second electrodes of the semiconductor elements. This also constitutes an obstacle to simplification of the manufacture of the photoelectric conversion device. In addition, the electrically connecting means occupies a significantly large area of the substrate relative to the area occupied by the semiconductor elements. This also imposes severe limitations on the number of semiconductor elements per unit area of the substrate and consequently the photovoltage per unit area of the substrate.

SUMMARY OF THE INVENTION

It is therefore an object of the present invention to provide a novel photoelectric conversion device which is free from the abovesaid defects of the prior art.

Another object of the present invention is to provide a method for the manufacture of the abovesaid photoelectric conversion device.

According to the present invention, the substrate on which a number of semiconductor elements is formed side by side in succession is a insulating sheet-like member having an insulating film formed on a metallic sheet-like member. The substrate is formed by the metallic sheet-like member, and hence is not brittle, allowing ease in handling the photoelectric conversion device. And since the substrate may be flexible, the photoelectric conversion device can easily be mounted on a light receiving panel.

Moreover, the substrate is formed by the metallic sheet-like member, so that even when pulled, it hardly elongates unlike a substrate of synthetic resin. Therefore, even if the substrate is pulled, for instance, when the photoelectric conversion device is mounted on the light receiving panel, no mechanical strain is imposed on the semiconductor elements formed on the substrate. Accordingly, there is no possibility that elongation of the substrate incurs deterioration of the characteristics of the semiconductor elements and consequently the characteristics of the photoelectric conversion device.

Further, the metallic sheet-like member forming the substrate is hardly degenerated by light while in use. This assures that even long-time use of the photoelectric conversion device would not distort the metallic sheet-like member or make it pervious to air or water. On the other hand, even if the insulating film formed on the surface of the metallic sheet-like member is degenerated and distorted by light, the amount of distortion is negligibly small since the insulating film is very thin. Accordingly, even if the substrate is distorted by light, the amount of distortion is negligibly small. Besides, even if the insulating film becomes pervious to air or water, the substrate has substantially no permeability to air or water since it is formed by the metallic sheet-like member. That is to say, the substrate effectively protects the semiconductor element from water or undesirable components to maintain the characteristics of the semiconductor elements unchanged, ensuring obtainment of the required photoelectric conversion efficiency.

Moreover, the metallic sheet-like member forming the substrate is hardly degenerated by external heat or heat generated in the semiconductor elements while in use. Therefore, the metallic sheet-like member is not distorted nor does it become pervious to air or water. On the other hand, even if the insulating film formed on the metallic sheet-like member is degenerated and distorted by heat, the amount of distortion is negligibly small since the film is very thin. Accordingly, even if the substrate is distorted by heat, the amount of distortion is also negligibly small. Besides, even if the insulating film is pervious to air or water, the substrate is substantially free from permeability to air or water since it is formed by the metallic sheet-like member. Consequently, water or undesirable components from the outside do not reach the semiconductor elements through the substrate, so that the semiconductor elements are free from deterioration of their characteristics, providing required photoelectric conversion efficiency.

Furthermore, the substrate has a metallic sheet-like member and the metal material forming the metallic sheet-like member is higher in heat resistance than synthetic resin. Therefore, the metallic sheet-like member is not substantially degenerated or deformed by heat applied for the formation of the semiconductor elements on the substrate. On the other hand, even if the insulating film on the surface of the metallic sheet-like member is degenerated or deformed by heat, the amount of degeneration or deformation is negligibly small since the insulating film is very thin. Accordingly, the photoelectric conversion device of the present invention is easy to manufacture.

Moreover, since the substrate is formed by an insulating sheet-like member having the insulating film on a metallic sheet-like member, there is no need of forming a relatively thick insulating layer on the substrate prior to the formation of the semiconductor elements. This permits simplification of the manufacturing process of the photoelectric conversion device. The substrate has the insulating film formed on the surface of the metallic sheet-like member but may be highly flexible to the same extent as the flexible metallic sheet-like member because the insulating film is small in thickness. Accordingly, the photoelectric conversion device may be flexible.

Besides, in the photoelectric conversion device of the present invention in which a number of semiconductor elements are formed side by side on the substrate, the substrate is formed by the aforementioned insulating sheet-like member, and the semiconductor elements are each formed by a non-single-crystal semiconductor laminate member.

In the case of such a photoelectric conversion device of the present invention, even if bending of the device imposes a strain on the non-single-crystal semiconductor laminate member forming the semiconductor element, the characteristics of the semiconductor element are not substantially degraded and, consequently, there is no likelihood that the photoelectric conversion device will not attain the required characteristics. Since the non-single-crystal semiconductor laminate member can be obtained at low cost and with ease as compared with the single-crystal semiconductor laminate member, the photoelectric conversion device can be fabricated at lower cost and with more ease than in the case where the semiconductor elements are each formed by the single-crystal semiconductor laminate member.

In addition, according to the present invention, the semiconductor elements formed on the substrate are electrically connected in series with one another through electrical connecting means so that a second electrode of one of adjacent semiconductor elements is coupled with a first electrode of the other semiconductor element via a coupling portion formed by an extension of the second electrode of the first-mentioned semiconductor element.

With such an arrangement, the area of the substrate occupied by the electrically connecting means relative to the area occupied by the semiconductor elements is smaller than in the case where conductive layers or leads are provided seperately of the first and second electrodes of adjacent electrodes for interconnecting them. This makes it possible to increase the number of semiconductor elements per unit area as compared with the case of using the conductive layers or leads provided separately of the first and second electrodes of adjacent semiconductor elements. Consequently, the photovoltage per unit area of the substrate can be raised.

Furthermore, according to the present invention, the electrical connecting means can be formed simultaneously with the formation of the second electrodes of the semiconductor elements, namely, no particular step is needed for forming the electrical connecting means.

According to the manufacturing method of the present invention, the semiconductor elements are formed by a process including the following steps (a) to (c):

(a) A first conductive layer which will ultimately serve as a first electrode of a plurality of semiconductor elements is formed on the substrate and the first conductive layer is subjected to first scanning by a laser beam, thereby providing the first electrode of each semiconductor element.

(b) A non-single-crystal semiconductor laminate member which will ultimately serve as a non-single crystal semiconductor laminate member of each semiconductor element having formed therein a PN or PIN junction is formed on the substrate in such a manner as to cover the first electrodes of the semiconductor elements, formed by the step (a), and the non-single-crystal semiconductor layer is subjected to a second scanning by a laser beam, thereby providing the non-single-crystal semiconductor laminate member of each semiconductor element.

(c) A second conductive layer which will ultimately serve as a second electrode of each semiconductor element is formed on the substrate in such a manner as to cover the non-single-crystal semiconductor laminate members of the semiconductor elements, formed by the step (b), and the subjected to a third scanning by a laser beam, thereby providing the second electrode of each semiconductor element.

According to the manufacturing method of the present invention including the abovesaid steps (a)–(c), since the semiconductor elements can be formed by use of a scanning laser beam, the photoelectric conversion device can be fabricated with more ease and with less steps than in the case of the conventional method including etching steps using masks.

Further, according to the manufacturing method of the present invention, since the laser beam scanning can be carried out accurately in position under the control or a computer, the semiconductor elements can be formed in a predetermined pattern with high precesion. This allows more ease in the manufacture of the photoelectric conversion device than in the case of employing the conventional method including the etching steps. Moreover, the number of semiconductor elements per unit area of the substrate and consequently the photovoltage per unit area of the substrate can easily be increased.

Besides, according to the manufacturing method of the present invention, the semiconductor elements are electrically connected at the same time as their second electrodes are formed. Accordingly, the photoelectric conversion device can more easily be manufactured than in the case of using the conventional method according to which the first and second electrodes of the semiconductor elements are connected by the electrical connecting means formed by conductive layers or leads provided separately of the electrodes. In addition, according to the present invention, the area of the substrate occupied by the semiconductor elements is smaller than in the case of the conventional method using the abovesaid electrical connecting means, the number of semiconductor elements per unit area of the substrate is larger than that obtainable with the conventional method. Consequently, the photoelectric conversion device with higher photovoltage than that obtainable with the conventional method can be easily manufactured.

Further, according to the manufacturing method of the present invention, the first conductive layer formed on the substrate is subjected to a first scanning by the laser beam in the abovesaid first step (a). In this case, the substrate is an insulating sheet-like member having an insulating film on a metallic sheet-like member, as described previously in connection with the semiconductor photoelectric conversion device of the present invention. The insulating film of the substrate can be formed of an organic resin of a sufficiently low thermal conductivity. The use of such an organic resin for the insulating film of the substrate prevents heat generated in the first conductive layer by the first laser beam scanning thereof from unnecessarily escaping to the outside through the substrate. This ensures effective accomplishment of the first laser beam scanning of the first conductive layer. Accordingly, the first electrodes of the semiconductor elements can easily be formed into desired patterns with high accuracy.

Other objects, features and advantages of the present invention will become more fully apparent from the following detailed description taken in conjunction with the accompanying drawings.

BRIEF DESCRIPTION OF THE DRAWINGS

FIGS. 4A to 4G are cross-sectional views schematically showing a sequence of steps involved in the manufacture of the photoelectric conversion device of the embodiment of the present invention depicted in FIGS. 1 to 3;

FIGS. 5 to 12 are schematic cross-sectional views, similar to FIG. 3, illustrating other embodiments of the present invention, respectively;

FIG. 14 is a schematic cross-sectional view taken on the line XIV—XIV in FIG. 13; and FIGS. 15A to 15H are a schematic cross-sectional views showing a sequence of steps involved in the manufacture of the photoelectric conversion device depicted in FIGS. 13 and 14.

DESCRIPTION OF THE PREFERRED EMBODIMENTS

A description will be given first, with reference to FIGS. 1 to 3, of an embodiment of the present invention.

Figure 1:
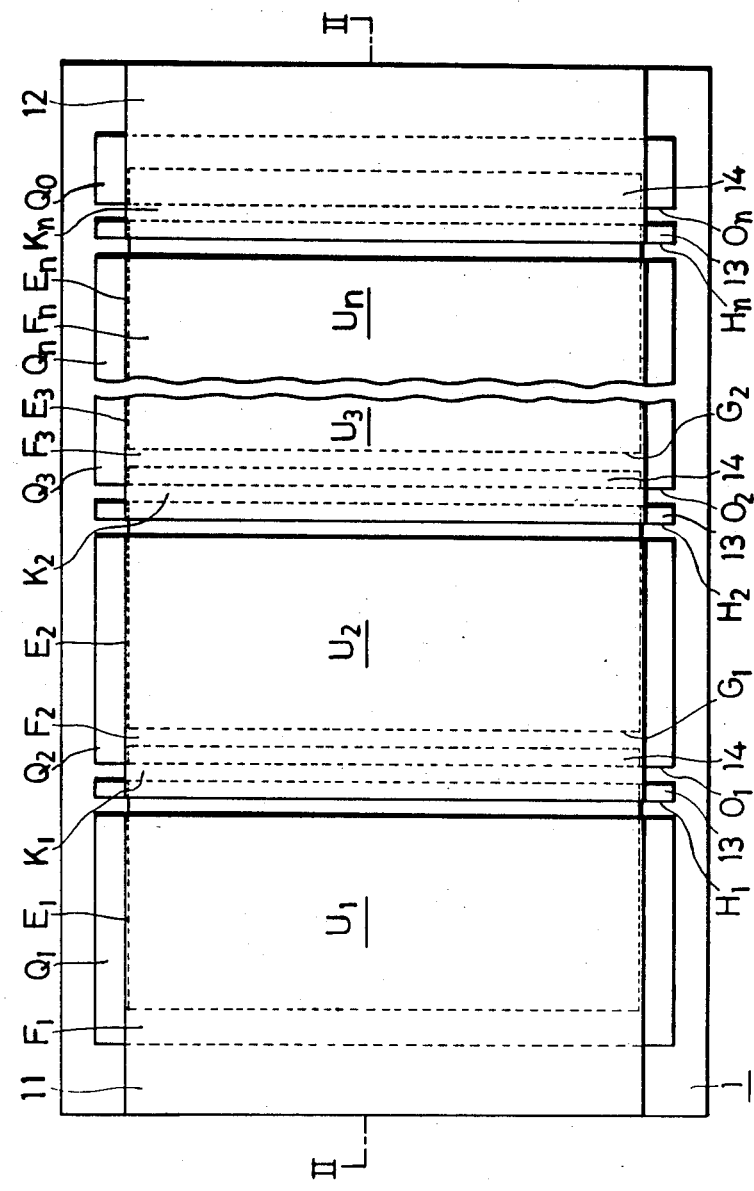
FIG. 1 is a plan view schematically illustrating an embodiment of the present invention.
Figure 2:
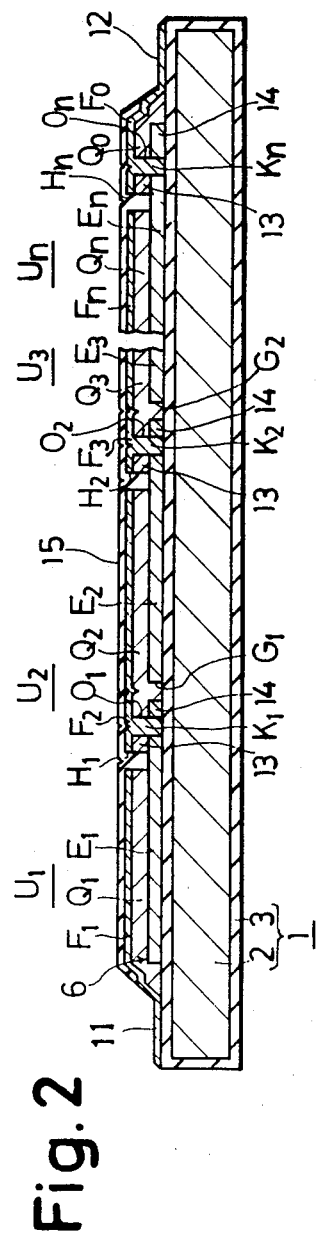
FIG. 2 is a schematic sectional view taken on the line II—II in FIG. 1.
Figure 3:
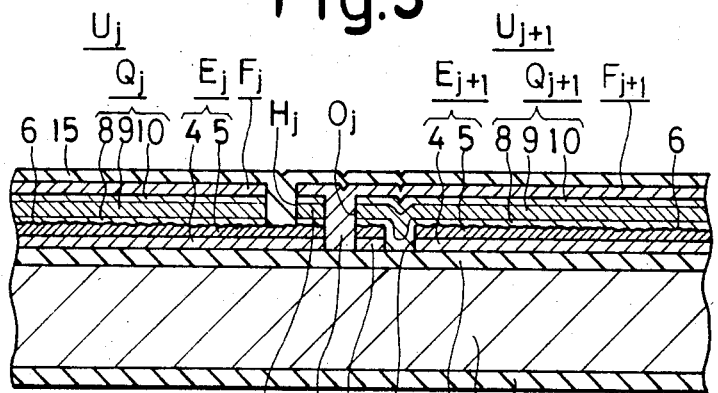
FIG. 3 is a detailed cross-sectional view showing on an enlarged scale parts of the embodiment of the present invention shown in FIG. 2.

The embodiment of the photoelectric conversion device of the present invention shown in FIGS. 1 to 3 has a plurality n (n being an integer larger than one) of semiconductor photoelectric conversion elements $U_1$ to $U_n$ formed side by side on a substrate 1.

The substrate 1 is formed by a flexible, insulating sheet-like member having an insulating film 3 formed on the surface of a flexible metallic sheet 2. The substrate 1 is, for example, rectangular in shape and 20 cm wide and 60 cm long.

The flexible metallic sheet-like member 2 forming the substrate 1 is made, for instance, of aluminum, an aluminum-base alloy or stainless steel and has a thickness of, for example, 10 to 200 μm, preferably, 50 to 150 μm.

The insulating film 3 formed on the surface of the flexible metallic sheet-like member 2 may be, for example, an oxide film resulting from oxidation of the surface of the sheet-like member. When the flexible metallic sheet-like member 2 is made of aluminum or an aluminum-base alloy, the abovesaid oxide film is an aluminum oxide (alumina $Al_2O_3$) or an insulating material consisting principally of aluminum oxide. The oxide film has a thickness small enough not to impair the flexibility of the flexible metallic sheet-like member 2, for instance, in the range of 0.1 to 2 μm, preferably, 0.3 to 1 μm. Such an oxide film can be formed by heating the flexible metallic sheet-like member 2 made of aluminum or aluminum-base alloy.

The insulating film 3 may be the abovesaid oxide film but, preferably, is a film of a material whose thermal conductivity is sufficiently lower than that of an inorganic insulating material, for example, glass (having a thermal conductivity of $2 \times 10^{-3}$ cal/sec/cm/°C. and a melting point of 500° to 600° C.). As such a film there can be used a film of an organic resinous material such as polyethylene terephthalate (PET) resin (thermal conductivity $6.9 \times 10^{-4}$ cal/sec/cm/°C., melting point 260° C.), polyimide resin (thermal conductivity $4.3 \times 10^{-4}$ cal/sec/cm/°C.), polyether sulfone (PES) resin ($4 \times 10^{-4}$ cal/sec/cm/°C.) or polyether ether ketone (PEEK) resin (thermal conductivity $6 \times 10^{-4}$ cal/sec/cm/°C., melting point 334° C.), preferably, polyimide resin. The insulating film 3 of such an organic resin is 0.1 to 5 μm thick and can be formed by coating and drying.

The semiconductor photoelectric conversion element $U_i$ (i=1, 2, . . . n) on the substrate 1 has an electrode $E_i$ formed on the substrate 1, a non-single-crystal semiconductor laminate member $Q_i$ formed on the electrode $E_i$ and an electrode $F_i$ formed on the non-single-crystal semiconductor laminate member $Q_i$ in opposing relation to the electrode $E_i$.

The electrode $E_i$ is, for example, rectangular in shape and has a width of 5 to 40 mm, preferably 15 mm and a length slightly smaller than the length of the substrate 1.

Electrodes $E_j$ (j=1, 2, . . . (n−1)) and $E_{j+1}$ are spaced apart by a groove $G_j$ which is shown to extend in the vertical direction in FIG. 1. The groove $G_j$ is, for example, 40 μm wide.

The electrode $E_i$ may be a non-reflective electrode but may be a reflective one.

When the electrode $E_i$ is a reflective electrode, light incident on the non-single-crystal semiconductor laminate member $Q_i$ on the opposite side from the substrate 1 passes through the non-single-crystal semiconductor laminate member $Q_i$, then is reflected by the surface of the electrode $E_i$ back to the non-single-crystal semiconductor laminate member $Q_i$ to pass therethrough. The larger the optical path length of the reflected light in the non-single-crystal semiconductor laminate member $Q_i$ is, the more the utilization efficiency of light is raised. From this point of view, it is preferable that the surface of the electrode $E_i$ on the side of the non-single-crystal semiconductor laminate member $Q_i$ have irregularities oblique to planes perpendicular to the substrate surface to form a diffuse reflection surface 6 at the boundary between it and the non-single-crystal semiconductor laminate member $Q_i$ as shown in FIG. 3.

In the case where the electrode $E_i$ is reflective, it may be of a single layer structure formed by a reflective conductive layer.

In order to simultaneously satisfy the requirements that the electrode $E_i$ be of high conductivity and high reflectivity and to prevent that when the non-single-crystal semiconductor laminate member $Q_i$ is formed, the material of its non-single-crystal semiconductor layer on the side of the electrode $E_i$ or an impurity contained therein reacts with the material of the reflective electrode to form a layer of high contact resistance in the interface between the electrode $E_i$ and the non-single-crystal semiconductor layer $Q_i$, it is preferable that the reflective electrode $E_i$ be of two-layer structure composed of a reflective conductive layer 4 and a light transparent conductive layer 5 formed on the layer 4 as shown in FIG. 3.

In the case where the electrode $E_i$ is such a reflective electrode of the two-layer structure made up of the reflective conductive layer 4 and the light transparent conductive layer 5, the reflective conductive layer 4 may preferably by made of metal. The metal may be stainless steel but, in view of the requirements of high conductivity and high reflectivity for the electrode $E_i$, it is preferable to employ aluminum (Al), silver (Ag), an aluminum-base alloy containing, for example, 0.1 to 2 volume % of silicon, or a silver-base alloy.

The light transparent conductive layer 5 may preferably be made of a metal oxide. In this case, in order to ensure that the layer 5 be high in conductivity and in transmittance and to prevent that when the non-single-crystal semiconductor laminate layer $Q_i$ is formed, reaction of the metallic oxide with the material or impurity of the non-single-crystal semiconductor layer of the laminate member $Q_i$ on the side of the electrode $E_i$ to form the abovesaid high contact resistance layer, it is preferable to form the layer 5 of a tin oxide ($SnO_2$ or SnO) or a metallic oxide consisting principally of such a tin oxide, for instance, a tin oxide containing halogen or, 1 to 10 wt % of antimony oxide in the event that the non-single-crystal semiconductor layer of the non-single-crystal semiconductor laminate member $Q_i$ on the side of the electrode $E_i$ is p-type. In the case where the layer of the non-single-crystal semiconductor laminate member $Q_i$ on the side of the electrode $E_i$ is N-type, it is preferable to use an indium oxide or a metallic oxide consisting principally thereof, for instance, an indium oxide containing 1 to 10 wt % of tin oxide. In this case, the light transparent conductive layer 5 is 300 to 600 Å thick.

In the case where the electrode $E_i$ is such a two-layer reflective electrode comprising the layer 4 and the layer 5, when the abovesaid diffuse reflection surface 6 is formed at the boundary between the electrode $E_i$ and the non-single-crystal semiconductor laminate member $Q_i$, it is formed on the surface of the layer 5 on the side of the laminate member $Q_i$.

In the semiconductor element $U_i$ formed on the substrate 1, the non-single-crystal semiconductor laminate member $Q_{j+1}$ (j=1, 2, ... (n−1)) on the aforesaid electrode $E_{j+1}$ extends laterally from the marginal edge of the electrode $E_{j+1}$ on the opposite side from the electrode $E_j$ to a position on the electrode $E_j$ on the side of the electrode $E_{j+1}$ across the groove $G_j$ separating the electrode $E_j$ and $E_{j+1}$ making contact with the non-single-crystal semiconductor laminate member $Q_j$.

The non-single-crystal semiconductor laminate member $Q_1$ formed on the electrode $E_1$ extends laterally onto the substrate 1 to cover the side surface of the electrode $E_1$ on the opposite side from the electrode $E_2$.

Further, the non-single-crystal semiconductor laminate member $Q_n$ is formed as a non-single-crystal-semiconductor laminate member $Q_0$ to laterally extend onto the substrate 1 to cover the side surface of the electrode $E_n$ on the opposite side from the electrode $E_{n-1}$.

The non-single-crystal semiconductor laminate member $Q_i$ is formed to vertically extend to cover the electrode $E_i$. The non-single-crystal semiconductor laminate member $Q_i$ has cut therein a groove $O_i$. The groove $O_i$ may be extended across the entire width of the semiconductor laminate member $Q_i$, as shown in FIG. 1, but it may also be extended to the vicinity of either side of the semiconductor laminate member $Q_i$ thereacross. Also it is possible to cut the groove $O_i$ in a discontinuous form lengthwise of the semiconductor laminate member $Q_i$. The grooves $O_1$ to $O_n$ are formed simultaneously.

The non-single-crystal semiconductor laminate member $Q_i$ formed on the electrode $E_i$ may be formed by one or more two-layer structures, each composed of a P-type or N-type non-single-crystal semiconductor layer and another non-single crystal semiconductor layer of the opposite conductivity type. Accordingly, the non-single-crystal semiconductor laminate member $Q_i$ can be formed to have at least one PN junction.

Furthermore, the non-single-crystal semiconductor laminate member $Q_i$ may preferably be formed by one or more three-layer structures, each composed of a P-type or N-type non-single-crystal semiconductor layer 8, an I-type non-single-crystal semiconductor layer 9 and a non-single-crystal semiconductor layer 10 opposite in conductivity type to the layer 8, as shown in FIG. 3. Accordingly, the non-single-crystal semiconductor laminate member $Q_i$ may preferably be formed to have at least one PIN junction.

The non-single-crystal semiconductor layer of the non-single-crystal semiconductor laminate member $Q_i$ on the side of the electrode $E_i$ is P-type when the electrode $E_i$ is made up of the reflective conductive layer 4 and the light transparent conductive layer 5 as described above and as illustrated in FIG. 3 and the light transparent conductive layer 5 is formed by a tin oxide or metallic oxide consisting principally of the tin oxide as described previously with respect to FIG. 3. When the layer 5 of the electrode $E_i$ making contact with the non-single-crystal semiconductor laminate member $Q_i$ is formed by an indium oxide or metallic oxide consisting principally of indium oxide, the non-single-crystal semiconductor layer of the non-single-crystal semiconductor laminate member $Q_i$ on the side of the electrode $E_i$ is N-type.

Accordingly, in the case where the non-single-crystal semiconductor laminate member $Q_i$ has the three-layer structure comprising the non-single-crystal semiconductor layers 8, 9 and 10 as illustrated in FIG. 3 and the electrode $E_i$ comprises the reflective conductive layer 4 and the light transparent conductive layer 5 and the light conductive layer 5 is formed by tin oxide or metallic oxide consisting principally of tin oxide, the non-single-crystal semiconductor layers 8 and 10 are P-type and N-type, respectively. When the light transparent conductive layer 5 is formed by indium oxide or metal oxide consisting principally of indium oxide, the non-single-crystal semiconductor layers 8 and 10 are N-type and P-type, respectively.

The non-single-crystal semiconductor layers making up the non-single-crystal semiconductor laminate member $Q_i$ may preferably be formed of silicon or a semiconductor consisting principally of silicon but it may also be formed of other semiconductors.

When the non-single-crystal semiconductor laminate member $Q_i$ has the three-layer structure composed of the non-single-crystal semiconductor layers 8, 9, and 10, the non-single-crystal semiconductor layer 8 may be formed, for instance, of silicon to a thickness of 5 to 300 Å, preferably 70 to 130 Å. Where the non-single-crystal semiconductor layer 8 is P-type, for example, boron (B) may be introduced thereinto as a P-type impurity.

The non-single-crystal semiconductor layer 9 can be formed of silicon as is the case with the non-single-crystal semiconductor layer 8 but its thickness may preferably be larger than that of the layer 8, for instance, 0.4 to 0.7 μm. The non-single-crystal semiconductor layer 9 contains a very small amount of a P-type impurity or does not substantially contain either of P-type and N-type impurities and, if any, their concentrations are negligibly low.

The non-single-crystal semiconductor layer 10 can also be formed of silicon as is the case with the non-single-crystal semiconductor layer 8. But since the non-single-crystal semiconductor layer 10 is disposed on the wide where the light to be converted is incident on the semiconductor element, it may preferably be formed of a semiconductor which has a larger energy band gap than does the semiconductor material of the non-single-crystal semiconductor layer 8, such as, for example, silicon carbide, expressed by $Si_xC_{1-x}(0<x<1)$. In this case, the non-single-crystal semiconductor layer 10 can be formed to a thickness of 5 to 300 Å, typically, in the range of 7 to 130 Å.

Incidentally, the aforesaid non-single-crystal semiconductor laminate member $Q_0$ has the same structure as the aforementioned member $Q_i$.

In the semiconductor element $U_i$ formed on the substrate 1, the electrode $F_i$ on the non-single-crystal semiconductor laminate member $Q_i$ is disposed opposite to the electrode $E_i$ formed on the non-single-crystal semiconductor laminate member $Q_i$.

In this case, the electrode $F_{j+1}$ extends from a position apart from the portion 13 of the non-single-crystal semiconductor laminate member $Q_{j+1}$ on the opposite side from the non-single-crystal semiconductor laminate member $Q_j$ onto its portion 13 on the side of the non-single-crystal semiconductor laminate member $Q_{j+1}$.

The electrode $F_1$ extends from a position away from the end portion of the non-single-crystal laminate member $Q_1$ on the side of the non-single-crystal semiconductor laminate member $Q_2$ to the marginal edge of the substrate 1 to cover the extension of the non-single-crystal laminate member $Q_1$ on the side surface of the electrode $E_1$.

On the non-single-crystal semiconductor laminate member $Q_n$, an electrode $F_0$ similar to the electrode $F_n$ is formed to extend from the portion 13 on the side of the non-single-crystal semiconductor laminate member $Q_0$ to the marginal edge of the substrate 1 to cover the side surface of the non-single-crystal semiconductor laminate member $Q_0$.

The electrodes $F_j$ and $F_{j+1}$ are isolated by an isolating portion $H_j$. The electrodes $F_{j+1}$ and $F_0$ are also isolated by an isolating portion $H_n$. The isolating portions $H_i$ may be simultaneously formed as grooves as is the case with the grooves $G_i$.

The electrode $F_i$ may be formed as a single layer structure as shown in FIG. 3 and may also be of the two-layer structure. Also it is possible to employ a three-layer structure.

The electrode $F_i$ is a transparent conductive layer and formed, for example, of a metallic oxide. In this case, it is required that the metal oxide be high in conductivity and in transmittance and, when forming the electrode $F_i$, would not react with the material or impurity of the non-single-crystal semiconductor layer of the non-single-crystal semiconductor laminate member $Q_i$ on the side of the electrode $F_i$ to form a layer which increases the contact resistance between the non-single-crystal semiconductor laminate member $Q_i$ and the electrode $F_i$ or a layer of low transmittance. To meet such requirements, when the non-single-crystal layer of the non-single-crystal semiconductor laminate member $Q_i$ on the side of the electrode $F_i$ is N-type, the electrode $F_i$ may preferably be formed of an indium oxide or metallic oxide consisting principally of indium oxide, such as, for example, an indium oxide contaning 1 to 10 wt % of tin oxide. When the non-single-crystal layer of the non-single-crystal semiconductor laminate member $Q_i$ on the side of the electrode $F_i$ is P-type, the electrode $F_i$ may preferably be formed of a tin oxide or metallic oxide consisting principally of tin oxide. The electrode $F_i$ can be formed, for instance, 300 to 600 Å thick.

In the case where the electrode Fi has the two-layer structure, the layer making contact with the non-single-crystal semiconductor laminate member $Q_i$ may preferably be a layer formed of tin oxide or consisting principally thereof, or a layer formed of the indium oxide or consisting principally thereof as described previously depending on whether the non-single-crystal semiconductor layer of the non-single-crystal semiconductor laminate member $Q_i$ is P-type or N-type. In this case, it is preferable that when the layer making contact with the non-single-crystal semiconductor laminate member $Q_i$ is formed of tin oxide or consisting principally thereof, the other layer be a layer formed of indium oxide or consisting principally thereof and, when the layer making contact with the laminate member $Q_i$ is formed of the indium oxide or consisting principally thereof, the other layer be a layer formed of tin oxide or consisting principally thereof.

The electrode $F_0$ formed to extend on the non-single-crystal semiconductor laminate member $Q_0$ has the same structure as the abovesaid electrode $F_i$.

The electrode $F_{j+1}$ of the semiconductor element $U_{j+1}$ (j=1, 2, ... (n−1)) is coupled with the electrode $E_j$ of the semiconductor element $U_j$ through a coupling portion $K_j$.

The coupling portion $K_j$ extends from the position where the electrode $F_{j+1}$ is opposite to the electrode $E_j$ to the region of the electrode $E_{j+1}$ opposite to the electrode $F_{j+1}$, passing through a groove $O_j$ by which the non-single-crystal semiconductor laminate members $Q_j$ and $Q_{j+1}$ are separated. Such a coupling portion $K_j$ is formed by an extension of the electrode $F_{j+1}$ formed simultaneously with the electrode $F_{j+1}$.

The electrode $F_1$ of the semiconductor element $U_1$ extends down to the surface of the substrate 1 as referred to previously and the extension constitutes an external connection terminal 11.

The electrode $F_0$ extending on the non-single-crystal semiconductor laminate member $Q_0$ is coupled with the electrode $E_n$ of the semiconductor element $U_n$ through a coupling portion $K_n$. In this case, the coupling portion $K_n$ extends from the position where the electrode $F_0$ is opposite to the electrode $E_n$ to the region 14 of the electrode $E_n$ opposite to the electrode $F_0$, passing through a groove $O_n$. Such a coupling portion $K_n$ is an extension of the electrode $F_0$ formed simultaneously therewith. The electrode $F_0$ extends on the side surface of the non-single-crystal semiconductor laminate member $Q_0$ in the direction away from the electrode $F_n$ to the marginal edge of the substrate 1, and the extending end portion forms a terminal 12 for external connection.

The isolating portion $H_j$ is formed to extend in the vertical direction in FIG. 1 to go down into the non-single-crystal semiconductor laminate member $Q_j$ to form therein a region 13 underlying the electrode $F_{j+1}$. The groove $O_j$ also extends across that portion of the electrode $E_j$ adjacent to the electrode $E_{j+1}$ in the thickwise direction. Accordingly, the electrode $E_j$ has an isolating portion 14 on the side of the electrode $E_{j+1}$.

The isolating portion $H_n$ is formed to extend in the vertical direction in FIG. 1 to go down into the non-single-crystal semiconductor laminate member $Q_n$ to form therein the region 13 underlying the electrode $F_0$.

The groove $O_n$ extends across that portion of the electrode $E_n$ on the opposite side from the electrode $F_0$ in the thickwise direction. Accordingly, the electrode $E_n$ has the isolated region 14 on the opposite side from the electrode $E_{n-1}$.

A transparent antireflection and protective film 15 is formed on the upper surface of the array to cover the aforesaid semiconductor elements $U_1$ to $U_n$. In this case, however, the antireflection and protective film 15 does not extend on the extended portions of the electrodes $F_1$ and $F_0$ forming the aforementioned external connection terminals 11 and 12, respectively.

The foregoing is a description of the arrangement of an embodiment of the photoelectric conversion device according to the present invention.

Next, a description will be given, with reference to FIGS. 4A to 4G, of an embodiment of the photoelectric conversion device manufacturing method of the present invention.

In FIGS. 4A to 4G, parts corresponding to those in FIGS. 1 and 2 are identified by the same reference numerals and characters and no detailed description thereof will be repeated.

Figure 4A:
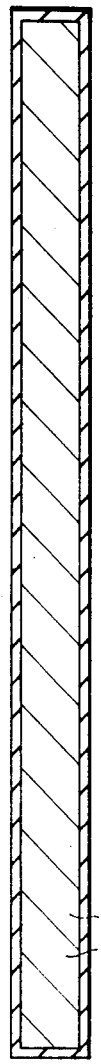

The manufacturing method of the photoelectric conversion device shown in FIGS. 4A to 4G is as follows:

The manufacture starts with the preparation of a substrate 1 as shown in FIG. 4A which is formed by an insulated sheet-like member having an insulating film 3 formed on the surface of a metallic sheet-like member 2 as described previously with respect to FIGS. 1 and 2.

Figure 4B:
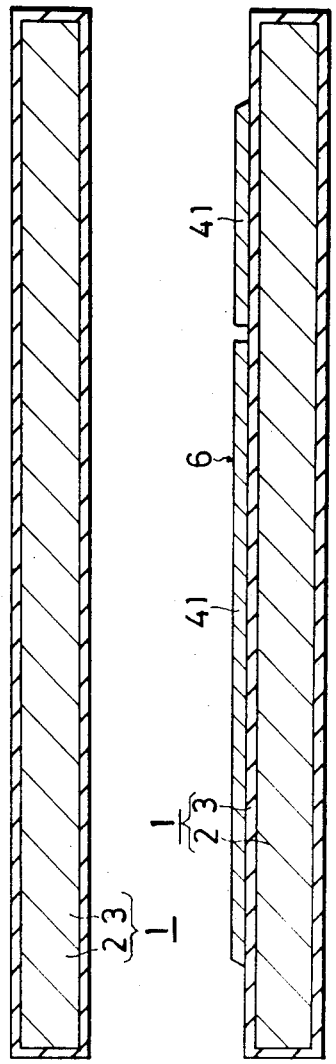

Then, as shown in FIG. 4B, the conductive layer 41 which will ultimately form the electrodes $E_1$ to $E_n$ described previously in connection with FIGS. 1 and 2 is formed by known method on the substrate 1.

In the case where the electrodes $E_1$ to $E_n$ are each formed to have the two-layer structure composed of the two layers 4 and 5 as described previously with regard to FIG. 3, the conductive layer 41 is made up of a layer which will ultimately serve as the layer 4 and another layer which ultimately serve as the layer 5, though neither are shown nor described in detail. The former layer is first formed on the substrate 1 by a known method, for example, vapor deposition, and then the latter layer is similarly formed thereon by a known method, for instance, vapor deposition.

In this case, the conductive layer for the light transparent conductive layer 5 can be formed so that its surface may cause diffuse reflection at the boundary between the electrode $E_i$ and the non-single-crystal semiconductor laminate member $Q_i$.

Figure 4C:
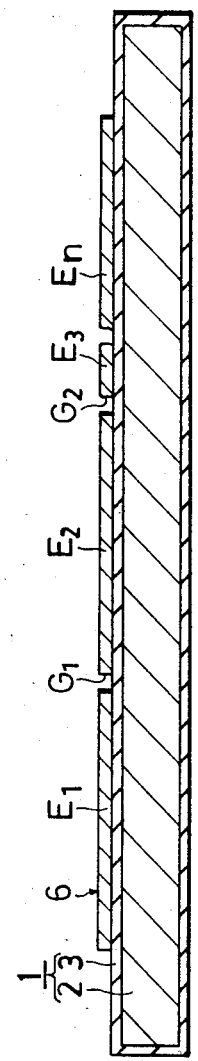

Next, the conductive layer 41 is scanned by a laser beam (not shown) having a diameter of 30 to 70 $\mu$m, typically, 40 $\mu$m, by which the aforementioned (n−1) grooves $G_i$ to $G_{n-1}$ are cut in the conductive layer 41 to form n electrodes $E_1$ to $E_n$ which are separated from adjacent ones by grooves $G_1$ to $G_{n-1}$, as shown in FIG. 4C. For this scanning, it is possible to employ a laser beam of a 1.06 $\mu$m wavelength from a YAG laser and a laser beam of a 0.488 or 0.512 $\mu$m wavelength from an argon laser.

The abovesaid laser beam scanning can be carried out in the air but may also be performed in the atmosphere of a gas or liquid which reacts with the conductive material of the layer 41 at high temperatures to spatter it from the substrate surface.

In this case, the gas used may be hydrogen fluoride (HF), hydrogen chloride (HCl), or Freon gas ($CF_4$, $CHF_3$, $CClF_3$ and like gases).

Liquids which can be used include hydrofluoric acid (HF), hydrochloric acid (HCl) or Freon liquid ($C_2F_3Cl_4$, $C_2F_3Cl_3$ or the like).

In the case where the laser beam scanning takes place in the air, burrs are likely to form on the upper marginal edges of the groove $G_j$. Accordingly, it is desirable that the laser beam scanning be followed by deburring through the use of the abovesaid gas or etching with an etchant such as hydrofluoric acid (HF), hydrochloric acid (HCl), or Freon liquids ($C_2F_3Cl_4$, $C_2F_3Cl_3$ or similar liquids).

Moreover, it is possible to accomplish the laser beam scanning of the conductive layer 41 easily and accurately by the aid of a computer while monitoring through a video camera device.

Figure 4D:
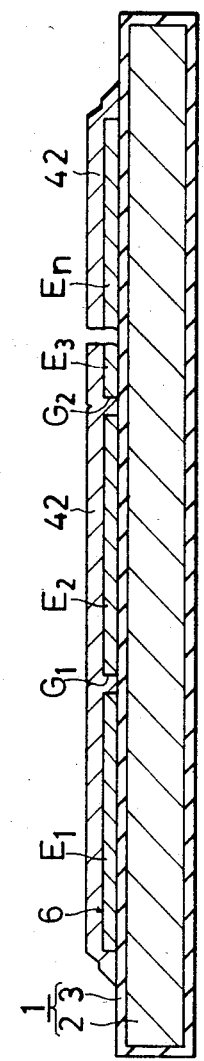

Next, a non-single-crystal semiconductor layer 42, which will ultimately form the non-single-crystal semiconductor laminate members $Q_1$ to $Q_n$ and $Q_0$ described previously with respect to FIGS. 1 and 2, is formed by a known method, for example, low-pressure CVD on the substrate 1 to fill the grooves $G_1$ to $G_{n-1}$ and to cover the electrodes $E_1$ to $E_n$, as shown in FIG. 4D, so that the regions of the layer 42 on the electrodes $E_1$ to $E_n$ may be the non-single-crystal semiconductor laminate members $Q_1$ to $Q_n$ described previously with respect to FIGS. 1 and 2.

Where the non-single-crystal semiconductor laminate members $Q_1$ to $Q_n$ are each formed as the three-layer structure consisting of the non-single-crystal semiconductor layers 8, 9 and 10 as described previously with regard to FIG. 3, non-single-crystal semiconductor layers which will ultimately be used as the non-single-crystal layers 8, 9 and 10 respectively, are formed in this order through the use of a known method, for instance, the low-pressure CVD method, thereby providing the non-single-crystal semiconductor laminate member 42.

Figure 4E:
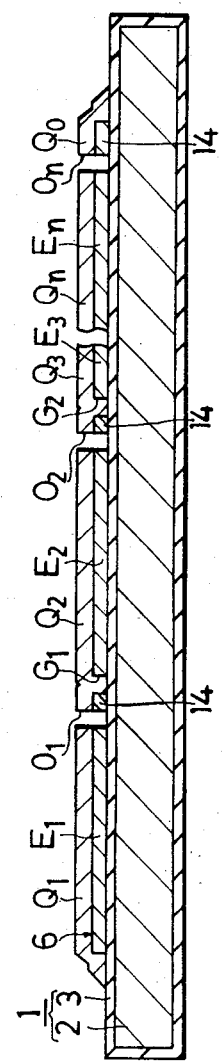

After this, the non-single-crystal semiconductor laminate members $Q_1$ to $Q_n$ are selectively removed by laser beam scanning to cut therein the aforementioned n grooves $O_1$ to $O_n$, as shown in FIG. 4E.

In this case, the groove $O_i$ (i=1, 2, . . . n) can be formed to extend down to the insulating film 2 of the substrate 1 across the electrode $E_i$ as illustrated. In such a case, the region 14 of the electrode $E_i$ is isolated from the other regions.

The laser beam scanning of the non-single-crystal semiconductor laminate members 42 and the electrodes $E_1$ to $E_n$ can take place in the air, as is the case with the conductive layer 41. It is also possible to carry out the laser beam scanning in the atmosphere of a gas which reacts with the materials of the non-single-crystal semiconductor laminate member 42 and the electrodes $E_1$ to $E_n$ at high temperatures to spatter them from the substrate surface. Also in this case, the gas used is hydrogen fluoride, hydrogen chloride, or Freon gas.

The laser beam scanning can also be carried out in a liquid which reacts with the materials of the laminate member 42 and the electrodes $E_1$ to $E_n$ at high temperature to remove them from the substrate surface. The liquid in this case can be hydrofluoric acid, hydrochloric acid, and the Freon liquid as is the case with the conductive layer 41.

In the case where the laser beam scanning of the non-single-crystal semiconductor laminate members 42 and the electrodes $E_1$ to $E_n$ is carried out in the air, it is desirable that the laser beam scanning be followed by deburring through the use of the aforesaid gas or etching with such etchants as mentioned previously.

The abovesaid laser beam scanning can also be performed easily and accurately with the aid of a computer while monitoring through a video camera device.

Figure 5:
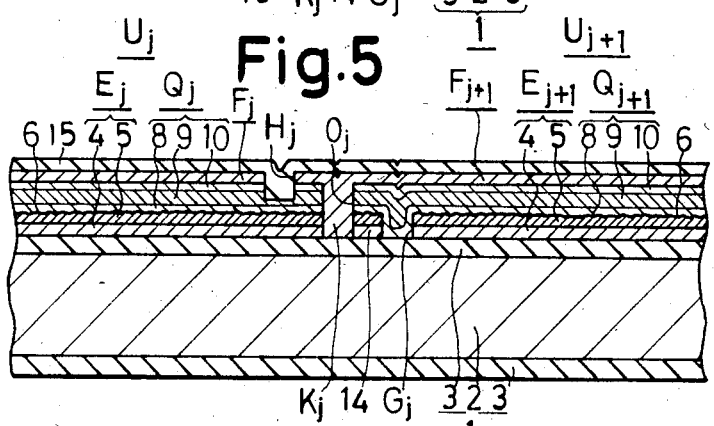

The groove $O_j$ ($j=1, 2, \ldots (n-1)$) is formed at a position spaced a predetermined distance apart from the groove $G_j$ laterally thereof (on the left thereof in FIG. 5). The predetermined distance is large as compared with the thickness of the non-single-crystal semiconductor laminate member 42. It is preferable, however, to minimize this distance. By the aid of a computer the groove $O_j$ can be provided in close proximity to the groove $G_j$ with high accuracy. This permits reduction of the area of the substrate 1 occupied by the region 14 of the electrode $E_j$. It is desirable that the groove $O_n$ be formed closely to the marginal edge of the electrode $E_n$ on the opposite side from the electrode $E_{n-1}$ so that the region 14 of the electrode $E_n$ may occupy less area of the substrate 1.

Next, a conductive layer 43, which will ultimately form the electrodes $F_1$ to $F_n$ and $F_0$ referred to with respect to FIGS. 1 and 2, is formed, for example, by vapor deposition on the substrate 1 to cover the non-single-crystal semiconductor laminate members $Q_1$ to $Q_n$ and to fill the grooves $O_1$ to $O_n$, forming coupling portions $K_1$ to $K_n$ (FIG. 4F).

In this case, the conductive layer 43 is formed to extend on the substrate 1 except for both marginal portions in its widthwise direction but it covers both marginal portions of the substrate 1 in its lengthwise direction.

Next, as shown in FIG. 4G, the conductive layer 43 is selectively removed by laser beam scanning as is the case with the non-single-crystal semiconductor laminate members 42. By this laser beam scanning there are formed in the conductive layer 43 n isolating portions $H_1$ to $H_n$, by which n electrodes $F_1$ to $F_n$ isolated by the isolating portions $H_1$ to $H_{n-1}$, respectively, and opposite to the electrodes $E_1$ to $E_n$ across the non-single-crystal semiconductor laminate members $Q_1$ to $Q_n$, respectively, and an electrode $F_0$ isolated by the isolating portion $H_n$ from the electrode $F_n$ and opposite to electrode $E_n$ are formed. In this case, the laser beam scanning is carried out so that the electrode $F_{j+1}$ may be linked with the electrode $E_j$ through the coupling portion $K_j$ and so that the electrode $F_0$ may be linked with the electrode $E_n$ through the coupling portion $K_n$.

By the abovesaid laser beam scanning, the isolating portion $H_i$ ($i=1, 2, \ldots$ n) can be formed to extend into the non-single-crystal semiconductor laminate member $Q_i$.

As is the case with the conductive layer 41, the laser beam scanning of the conductive layer 43 can be effected in the air and may also be carried out in the atmosphere of a gas which reacts with the materials of the conductive layer 43 and the non-single-crystal semiconductor laminate members $Q_1$ to $Q_n$ at high temperatures to spatter them from the substrate surface. The gas used in this case may be hydrogen fluoride, hydrogen chloride, or Freon gas. It is also possible to conduct the laser scanning in a liquid which reacts with the materials of the conductive layer 43 and the non-single-crystal semiconductor laminate members $Q_1$ to $Q_n$ and high temperatures to remove them from the substrate surface. The liquid used in this case may be hydrofluoric acid, hydrochloric acid, or Freon liquid.

Also in the case of performing the laser beam scanning of the conductive layer 43 in the air, it is desirable that the laser beam scanning be followed by deburring through the use of the aforesaid gas or etching using the aforesaid liquid as the etchant.

By the laser beam scanning for the conductive layer 43, the isolating portion $H_i$ can be provided in the form of a groove as illustrated.

The laser beam scanning of the conductive layer 43 can also be carried out easily and accurately with the aid of a computer while monitoring through a video camera device.

Further, the isolating portion $H_i$ is formed a predetermined distance apart from the groove $O_i$ laterally thereof (on the left thereof in the drawing). The predetermined distance is large as compared with the thickness of the non-single-crystal semiconductor laminate member 43, but it may preferably be selected as small as possible. By the aid of a computer the isolating portion $H_i$ can be formed in close proximity to the groove $O_i$ with high precision. This allows reduction of the area of the substrate 1 occupied by the region 13 formed in the non-single-crystal semiconductor laminate member $Q_i$.

Next, a transparent antireflection and protective film 15 is formed by a known method on the array to cover the electrodes $F_1$ to $F_n$ and $F_0$ and the isolating portion $H_1$ as shown in FIG. 4G.

In the manner described above, the photoelectric conversion device of the present invention, shown in FIGS. 1 and 2, is manufactured.

The above is a description of an embodiment of the present invention and an example of its manufacturing method.

According to the photoelectric conversion device of FIGS. 1 and 2, when light (not shown) is incident thereon from the side of the substrate 1 or the electrodes $F_1$ to $F_n$ each semiconductor element $U_i$ ($i=1, 2, \ldots$ n) carries out photoelectric conversion to generate photovoltage across its electrodes $E_i$ and $F_i$.

The electrodes $F_{j+1}$ ($j=1, 2, \ldots (n-1)$) of the semiconductor element $U_{j+1}$ is linked with the electrode $E_j$ of the semiconductor element $U_j$ through the coupling portion $K_j$ and the electrode $F_1$ of the semiconductor element $U_1$ is connected to an external connection terminal 11 and the electrode $E_n$ of the semiconductor element $U_n$ is connected to an external connection terminal 12 through the coupling portion $K_n$ and the electrode $F_0$.

Accordingly, the semiconductor elements $U_1$ to $U_n$ are sequentially connected in series through the coupling portions $K_1$ to $K_{n-1}$ and connected to the external connection terminals 11 and 12.

Consequently, upon incidence of light, there is developed across the external connection terminals 11 and 12 the photovoltage that is equal to the sum of voltage produced by the semiconductor elements $U_1$ to $U_n$.

According to the embodiment of FIGS. 1 and 2, since the substrate 1 is formed by an insulating sheet-like member having an insulating film 3 formed on the surface of a metallic sheet-like member 2, the photoelectric conversion device of the present invention is advantageous in that it is easy to handle and hence easy to mount on a light receiving panel, and its characteristics are not degraded when it is mounted on the light receiving panel, or by long-time service, as referred to previously. The advantages are more marked in the cases where the insulating sheet-like member is flexible.

In the embodiment of FIGS. 1 and 2 the semiconductor elements $U_1$ to $U_n$ are formed by the non-single-crystal semiconductor laminate members $Q_1$ to $Q_n$, respectively. Therefore, even if the substrate 1 is bent to impose a strain on the non-single-crystal semiconductor laminate members $Q_1$ to $Q_n$ to some extent, the characteristics of the photoelectric conversion device are not degraded, and the device can easily be fabricated at low cost, as described previously.

Moreover, the semiconductor elements $U_1$ to $U_n$ are sequentially connected in series through the coupling portions $K_1$ to $K_{1-n}$ and the semiconductor elements $U_1$ to $U_n$ are connected to external connection terminals 11 and 12, respectively, as described previously. The coupling portions $K_1$ to $K_n$ constitute electrical connecting means for electrically connecting the semiconductor elements $U_1$ to $U_n$ in series between the external connection terminals 11 and 12 but the coupling portions $K_j$ and $K_n$ are formed by the extended portions of the electrodes $F_{j+1}$ of the semiconductor element $U_{j+1}$ and $F_0$.

Consequently, as described previously, the area of the substrate 1 occupied by the electrical connecting means is smaller than the area of the substrate occupied by the semiconductor elements $U_1$ to $U_n$, so that the photovoltage per unit area of the substrate 1 is high. Further, the electrical connecting means can easily be formed. Accordingly, the photoelectric conversion device is easy to produce. In addition, by forming the electrodes $E_i$ of the semiconductor element $U_i$ as reflective electrodes as described previously with respect to FIG. 3, incident light can efficiently be utilized by the semiconductor $U_i$, providing for increased photo-voltage per unit area of the substrate 1.

Besides, in the case where the abovesaid reflective electrode is made up of the reflective conductive layer 4 of aluminum, silver, or an alloy consisting principally of one of them, disposed on the side of the substrate 1, and the light transparent conductive layer 5 is formed on the reflective conductive layer 4 in contact with the non-single-crystal semiconductor laminate member $Q_i$ as described previously with respect to FIG. 3, an excellent ohmic contact can be made between the electrode $E_i$ and the non-single-crystal semiconductor laminate member $Q_i$ and high reflectivity can be obtained, so that high photovoltage can be obtained from the semiconductor element $U_i$ with practically no loss and the efficiency of utilization of light can be improved. These features can be made more distinct by forming the surface of the light transparent conductive layer 5 so that a diffuse reflection surface 6 may be provided at the boundary between the electode $E_i$ and the non-single-crystal semiconductor laminate member $Q_i$ as referred to previously in connection with FIG. 3. The abovesaid features can be made more marked by forming the light transparent conductive layer 5 of the electrode $E_i$ of a tin oxide or a metallic oxide consisting principally thereof, depending on whether the non-single-crystal semiconductor layer of the semiconductor element $U_i$ on the side of the electrode $E_i$ is P-type or N-type.

Further, in the case where the electrodes $E_j$ and $E_{j+1}$ of the semiconductor elements $U_j$ and $U_{j+1}$ are separated by the groove $G_j$ as illustrated, the non-single-crystal semiconductor laminate member $Q_{j+1}$ of the semiconductor element $U_{j+1}$ is formed to extend from the electrode $E_{j+1}$ onto the portion of the electrode $E_j$ on the side of the electrode $E_{j+1}$ across the groove $G_j$, the non-single-crystal semiconductor laminate members $Q_j$ and $Q_{j+1}$ are separated by the groove $O_j$ on the side of the electrode $E_j$ opposite from the groove $G_j$ and the coupling portion $K_j$ formed by the extension of the electrode $F_{j+1}$ is coupled with the electrode $E_j$ through the groove $O_j$, the semiconductor elements $U_1$ to $U_n$ can be arranged on the substrate 1 with a high density, providing for increased photovoltage per unit area of the substrate.

Where the groove $O_j$ cut in the non-single-crystal semiconductor laminate member $Q_j$ is extended into the electrode $E_j$ as illustrated, the coupling portion $K_j$ extending from the electrode $F_{j+1}$ makes side-contact with the electrode $E_j$ and hence makes good ohmic contact therewith, thereby ensuring obtainment of large electromotive force across the external connection terminals 11 and 12 with no appreciable loss.

With such an arrangement wherein the electrodes $F_j$ and $F_{j+1}$ are isolated by the isolating portion $H_j$ provided on the side of the non-single-crystal semiconductor laminate member $Q_j$ opposite from the groove $O_j$ formed at the position opposite to the groove $G_j$, the semiconductor elements $U_1$ to $U_n$ can be arranged on the substrate 1 with higher density, providing for further increased photovoltage per unit area of the substrate 1.

Since the isolating portion $H_j$ is formed to extend into the non-single-crystal semiconductor laminate member $Q_j$ as illustrated, substantially no leakage occurs through the non-single-crystal semiconductor laminate members $Q_j$ between the electrode $E_j$ and $F_{j+1}$, thereby ensuring obtainment of large electromotive force across the external connection terminals 11 and 12.

In the embodiment of FIGS. 1 and 2, the non-single-crystal semiconductor laminate member $Q_1$ of the semiconductor element $U_1$ is formed on the electrode $E_1$ to extend onto the substrate 1 and the electrode $F_1$ is formed on the non-single-crystal semiconductor laminate member $Q_1$ to similarly extend onto the substrate 1 and the extended portion is used as the external connection terminal 11. With such an arrangement, the series array of the semiconductor elements $U_1$ to $U_n$ can easily be connected at one end to the external connection terminal 11. This permits simplification of the construction of photoelectric conversion device as a whole.

Further, in the embodiment of FIGS. 1 and 2, the non-single-crystal semiconductor laminate member $Q_n$ is formed to extend on the side surface of the electrode $E_n$ towards the other edge of the substrate 1. The electrode $F_0$ is formed on the non-single-crystal semiconductor laminate member $Q_n$ to extend on to the substrate surface and the electrode $F_0$ is coupled with the electrode $E_n$ through the coupling portion $K_n$. The extended portion of the electrode $F_0$ on the substrate 1 is used as the external connection terminal 12. Accordingly, the series array of the semiconductor elements $U_1$ to $U_n$ can easily be connected at one end to the external connection terminal 12, permitting simplification of the overall structure of the photoelectric conversion device.

The manufacturing method of the present invention, shown in FIG. 4, includes the following steps for the fabrication of the photoelectric conversion device shown in FIGS. 1 and 2.

(a) The first conductive layer 41 is formed on the substrate 1 formed by insulating sheet-like member having an insulating film 3 formed on a metallic sheet-like member 2 (FIG. 4B).

(b) The first conductive layer 41 is subjected to a first laser beam scanning to form therein the first grooves $G_1$ to $G_{n-1}$ to provide the first electrodes $E_1$ to $E_n$ separated by the first grooves $G_1$ to $G_{n-1}$, respectively (FIG. 4C).

(c) The non-single-crystal semiconductor laminate member 42 is formed on the substrate 1 to cover the first grooves $G_1$ to $G_{n-1}$ and the electrodes $E_1$ to $E_n$ (FIG. 4D).

(d) The non-single-crystal semiconductor laminate member 42 is subjected to a second laser beam scanning to form therein the second grooves $O_1$ to $O_n$ to expose therethrough the first electrodes $E_1$ to $E_n$ to the outside and to provide the n non-single-crystal semiconductor laminate members $Q_1$ to $Q_n$ defined by the second grooves $O_1$ to $O_n$, respectively (FIG. 4E).

(e) The second conductive layer 43 is formed on the substrate 1 to continuously extend on the non-single-crystal semiconductor laminate members $Q_1$ to $Q_n$ and into the grooves $O_1$ to $O_{n-1}$ to provide coupling portions $K_1$ to $K_{n-1}$ which are connected to the first electrodes $E_1$ to $E_{n-1}$ through the grooves $O_1$ to $O_{n-1}$, respectively (FIG. 4F).

(f) The second conductive layer 43 is subjected to a third laser beam scanning to form therein the n isolating portions $H_1$ to $H_{n-1}$ to provide the n second electrodes $F_1$ to $F_n$ which are isolated by the isolating portions $H_1$ to $H_{n-1}$, respectively, and are opposite to the electrodes $E_1$ to $E_n$ through the non-single-crystal semiconductor laminate members $Q_1$ to $Q_n$ so that the second electrodes $F_2$ to $F_n$ are connected to the first electrodes $E_1$ to $E_{n-1}$ through the coupling portions $K_1$ to $K_{n-1}$, respectively (FIG. 4G).

Accordingly, the manufacturing method of the present invention shown in FIG. 4 permits easy manufacture of the photoelectric conversion device shown in FIGS. 1 and 2.

According to the manufacturing method of the present invention shown in FIG. 4, the second groove $O_j$ (j=1, 2, ... (n−1)) can easily be formed a predetermined distance apart from the first groove $G_j$ but adjacent thereto and, further, the isolating portion $H_j$ can easily be formed a predetermined distance apart from the first groove $G_j$ but adjacent to the groove $O_j$. Accordingly, the semiconductor elements $U_1$ to $U_n$ can be formed on the substrate 1 with high density, allowing ease in the manufacture of the photoelectric conversion device which generates high photovoltage per unit area of the substrate 1.

Further, since the second groove $O_j$ can easily be formed to extend in the direction of thickness of the first electrode $E_j$, the coupling portion $K_j$ can easily be formed in contact with the side of the first electrode $E_j$ exposed to the groove $O_j$. This ensures good contact between the coupling portion $K_j$ and first electrode $E_j$, providing for reduced internal loss.

Moreover, by performing the first laser beam scanning of the first conductive layer 41 in the air or in the atmosphere of a gas or liquid which reacts with the conductive material of the first conductive layer 41 at high temperatures to spatter it from the surface of the substrate 1, the first grooves $G_1$ to $G_{n-1}$ and the first electrodes $E_1$ to $E_n$ can easily be formed. By performing the second laser beam scanning of the non-single-crystal semiconductor layer 42 in the air or in the atmosphere of a gas or liquid which reacts with the non-single-crystal semiconductor of the non-single-crystal semiconductor laminate member 42 to spatter it from the surface of the substrate 1, the second grooves $O_1$ to $O_n$ and the non-single-crystal semiconductor laminate members $Q_1$ to $Q_n$ can easily be formed. By branching the third laser beam scanning of the second conductive layer 43 in the air or in an atmosphere of oxygen, or in the atmosphere of a gas or liquid which reacts with in the conductive material of the second conductive layer 43 to spatter it from the surface of the substrate 1, the isolating portions $H_1$ to $H_{n-1}$ and the second electrodes $F_1$ to $F_n$ can easily be formed. Accordingly, the photoelectric converter having the aforesaid advantages can easily be fabricated.

Furthermore, the first conductive layer 41 formed on the substrate 1 is subjected to the first laser beam scanning in the abovesaid step (b) to cut first grooves $G_1$ to $G_{n-1}$ in the first conductive layer 41, providing the first electrodes $E_1$ to $E_n$. In this case, the substrate 1 is an insulating sheet-like member having an insulating film 3 on a metallic sheet-like member 2. The insulating film 3 of the substrate 1 can be formed of an organic resin of a sufficiently low thermal conductivity. With the insulating film 3 of such an organic resin, it is possible to prevent heat generated in the first conductive layer 41 on the insulating film 3 by the first laser beam scanning thereof from unnecessarily escaping to the outside through the substrate 1. Therefore, the first laser beam scanning of the first conductive layer 41 is effectively carried out. That is, the first grooves $G_1$ to $G_{n-1}$ can easily be provided without leaving therein the material of the first conductive layer 4. Therefore, the first electrodes $E_1$ to $E_n$ of the semiconductor elements $U_1$ to $U_n$ can easily be formed in desired patterns with high accuracy.

In addition, since the third laser beam scanning of the second conductive layer 43 can readily be carried out so that the isolating portion $H_j$ may extend into the non-single-crystal semiconductor laminate member $Q_j$, the non-single-crystal semiconductor laminate members $Q_1$ to $Q_n$ can easily be formed with substantially no leakage between the non-single-crystal semiconductor laminate members $Q_j$ and $Q_{j+1}$. Accordingly, the semiconductor elements $U_1$ to $U_n$ of the high photovoltage can easily be obtained.

A description will be given of other embodiments of the photoelectric conversion device of the present invention.

In the embodiment of the photoelectric conversion device shown in FIGS. 1 to 3, the electrodes $F_j$ and $F_{j+1}$ of the semiconductor elements $U_j$ and $U_{j+1}$ are isolated by the isolating portion $H_j$ provided in the form of a groove and the isolating portion $H_j$ extends across the non-single-crystal semiconductor laminate member $Q_i$.

The embodiment of FIG. 5 corresponding to FIG. 3 is identical in construction with the embodiment of FIGS. 1 to 3 except that the isolating portion $H_j$ does not extend through the non-single-crystal semiconductor laminate member $Q_i$.

Such isolating portions $H_j$ can easily be formed by adjusting the scanning and/or power of the laser beam in the laser beam scanning of the conductive layer 43 described previously in connection with FIG. 4.

Figure 6:
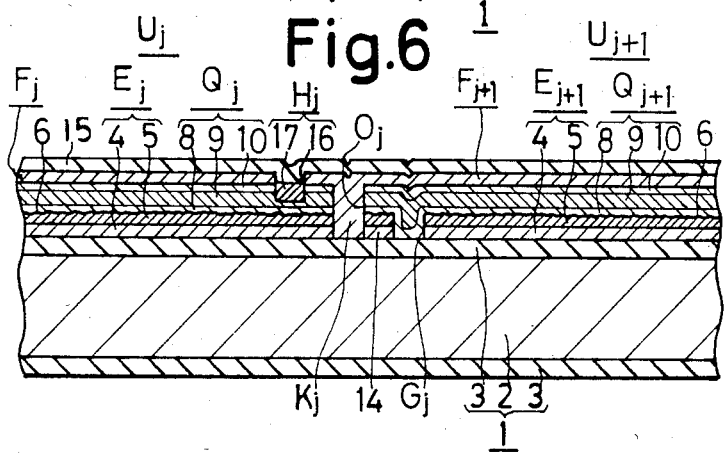

Further, the embodiment of FIG. 6 corresponding to the FIG. 3 photoelectric conversion device of the present invention is identical in construction with the embodiment of FIGS. 1 to 3 except that the isolating portion $H_j$ consists of the groove 16 defined between the electrodes $F_j$ and $F_{j+1}$ and the oxide 17 of the non-single-crystal semiconductor forming the non-single-crystal semiconductor laminate member $Q_j$, which is formed in the upper half portion thereof.

Such isolating portions $H_j$ can easily be formed by carrying out in an oxygen atmosphere the laser beam scanning of the conductive layer 43 described previously with respect to FIG. 5.

Figure 7:
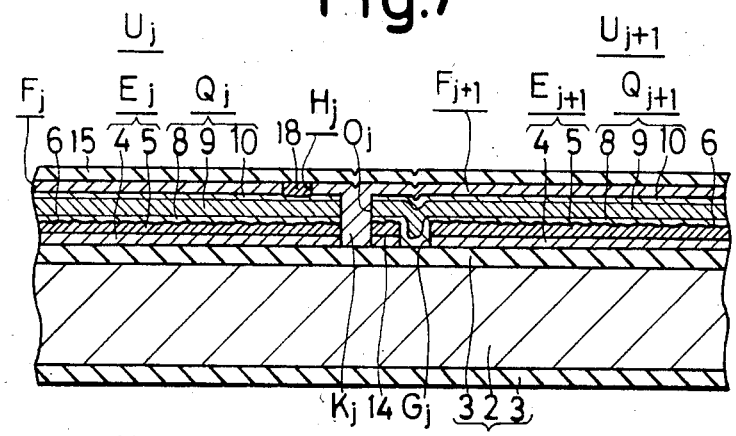

Likewise, the embodiment of FIG. 7 is identical in construction with the embodiment of FIGS. 1 to 3 except that the isolating portion $H_j$ is formed by an oxide 18 which results from oxidation of the conductive material forming the electrodes $F_j$ and $F_{j+1}$ and separates them as shown. Such isolating portions $H_j$ can easily be formed by the same laser beam scanning as that employed for the embodiment of FIG. 6.

Figure 8:
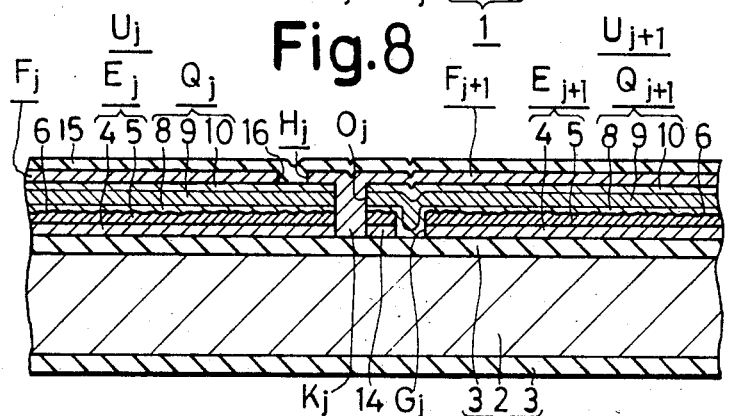

The embodiment of FIG. 8 is also identical in construction with the embodiment of FIGS. 1 to 3 except that the isolating portion $H_j$ is formed by the groove 16 which barely extends into the non-single-crystal semiconductor laminate member $Q_j$ but separates the electrodes $E_j$ and $E_{j+1}$ as shown. Such isolating portion $H_j$ can easily be formed by adjusting the scanning speed and/or power of the laser beam in the laser beam scanning as in the embodiment of FIG. 4.

It is evident that all the arrangements of the embodiments having the isolating portions $H_j$, shown in FIGS. 5 to 8, have the same features as those of the embodiment of FIGS. 1 to 3, though not described in detail.

In the embodiment of FIGS. 1 to 3, the groove $O_j$, which separates the non-single-crystal semiconductor laminate member $Q_j$ and $Q_{j+1}$ of the semiconductor elements $U_j$ and $U_{j+1}$ and through which extends the coupling portion $K_j$ for connecting the electrode $F_{j+1}$ of the semiconductor element $U_{j+1}$ to the electrode $E_j$ of the semiconductor element $U_j$, is provided on the side of the electrode $E_j$ at a position a predetermined distance apart from the groove $G_j$ which defines the semiconductor elements $U_j$ and $U_{j+1}$.

Figure 9:
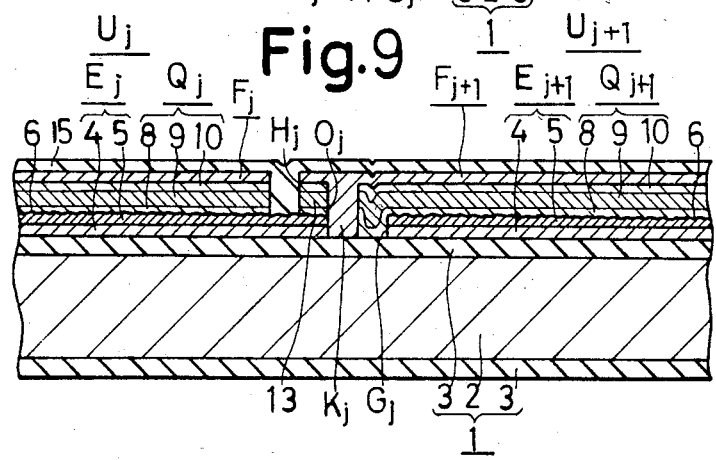

The embodiment of FIG. 9 corresponding to FIG. 3 is identical in construction with the embodiment of FIGS. 1 to 3 except that the grooves $O_j$ and $G_j$ intercommunicate in the lateral direction and, consequently, the electrode $E_i$ has no portion 14.

The embodiment of FIG. 9, though not described in detail, has the same features as those of the embodiment of FIGS. 1 to 3.

In addition, since the electrode $E_i$ has no portion 14, the photovoltage of the semiconductor element $U_i$ can be increased correspondingly with the same area of the substrate 1 occupied by the electrode $E_i$ as compared with the photovoltage obtainable with the embodiment of FIGS. 1 to 3, or the same photovoltage can be obtained with the smaller length of the electrode $E_i$ in the lateral direction than in the first embodiment.

Accordingly, the embodiment of FIG. 9 is smaller in size but larger in electromotive force than the embodiment of FIGS. 1 to 3.

The embodiment of FIG. 10 is also identical in construction with the embodiment of FIGS. 1 to 3 except that as is the case with the embodiment of FIG. 9, the grooves $O_j$ and $G_j$ interconnect in the lateral direction and, accordingly, the electrode $E_j$ has no portion 14. In the embodiment of FIG. 10, however, half of the groove $O_j$ on the opposite side from the groove $G_j$ does not extend entirely across the electrode $E_j$ in its thickwise direction. In the case where the electrodes $E_j$ and $E_n$ are each comprised of the reflective conductive layer 4 and the light transparent conductive layer 5, since their materials are different, the abovesaid groove $O_j$ can easily be formed by the laser beam scanning of the non-single-crystal semiconductor laminate member 42 and the electrodes $E_1$ to $E_n$ described previously with respect to FIG. 4.

The embodiment of FIG. 10 also possesses the same advantages as does the embodiment of FIG. 9.

In the embodiment of the photoelectric conversion device of the present invention depicted in FIGS. 1 to 3, the groove $O_j$ extends through the electrode $E_j$ to reach the substrate 1, and the coupling portion $K_j$ makes contact only with the side of the electrode $E_j$ exposed to the groove $O_j$.

In another embodiment of the photoelectric conversion device of the present invention, however, as shown in FIG. 11, the groove $O_j$ is not completely through the electrode $E_j$ but is through only layer 5 of the electrode $E_j$ and the coupling portion $K_j$ is formed to make contact with the layer 4 of the electrode $E_j$ exposed to the groove $O_j$.

In another embodiment of the photoelectric conversion device of the present invention, however, as shown in FIG. 12, the groove $O_j$ is not extended into the electrode $E_j$ at all and the coupling portion $K_j$ is formed to make contact only with the top of the electrode $E_j$ exposed to the groove $O_j$.

In the embodiments illustrated in FIGS. 11 and 12, the groove $O_j$ can easily be formed by the same laser beam scanning as that for the non-single-crystal semiconductor laminate member $Q_j$ described previously with respect to FIG. 4 but, in this case, the intensity of the laser beam is adjusted suitably.

It will be seen that any of the structures of the embodiments provided with the grooves shown in FIGS. 11 and 12 possesses the same advantages as are obtainable with the embodiment of FIGS. 5 to 11, though not described in detail.

In the embodiment of FIGS. 1 to 3, the series connected array of the semiconductor elements $U_1$ to $U_n$ constituting one photoelectric conversion device on the substrate 1 is connected at one end to the external connection terminal 11, which is formed by the extended portion of the electrode $E_1$ of the semiconductor element $U_1$ on the substrate 1, and connected at the other end to the external connection terminal 12 which is formed by the extended portion of the electrode $F_0$ on the substrate 1 and connected to the electrode $E_n$ through the coupling portion $K_n$.

Figure 13:
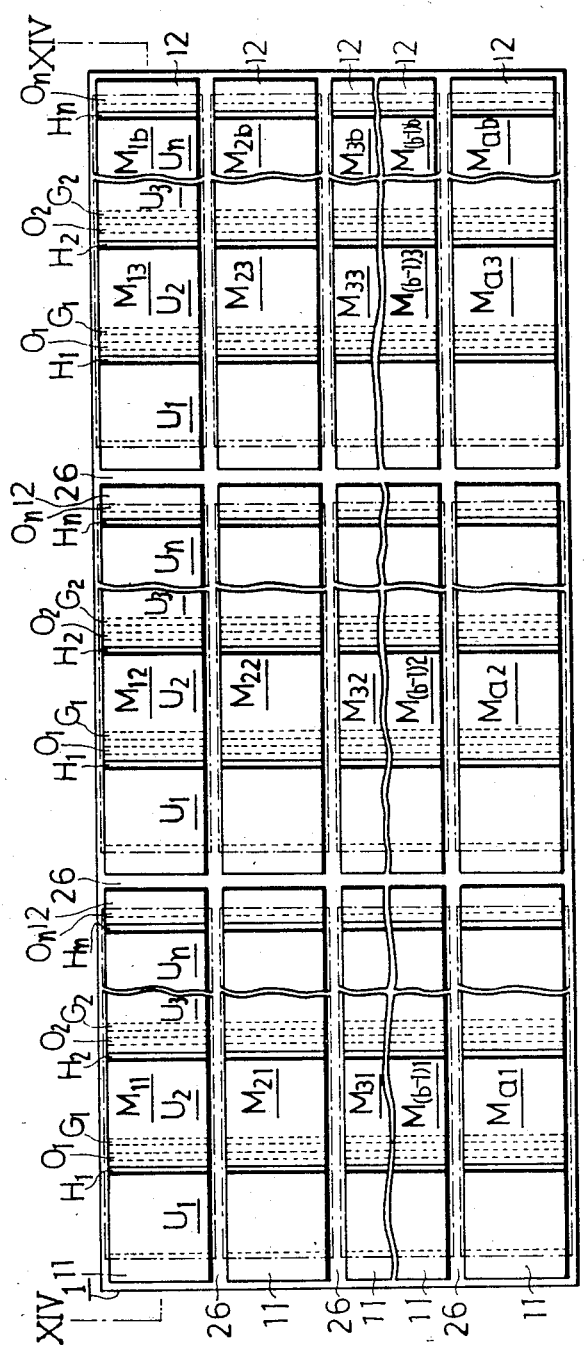
FIG. 13 is a plan view schematically illustrating another embodiment of the present invention.
Figure 15C:
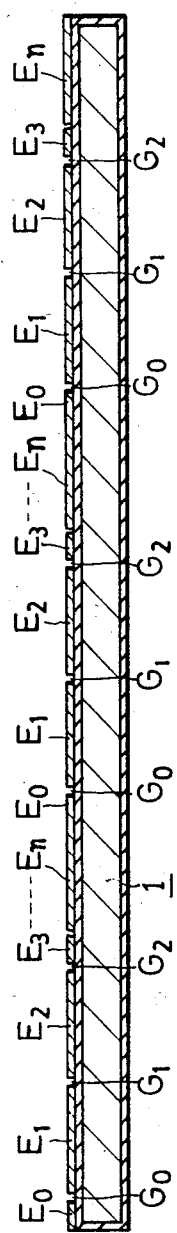
Figure 15D:
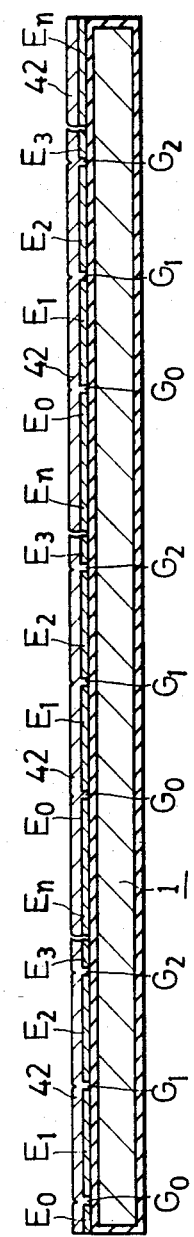
Figure 15E:
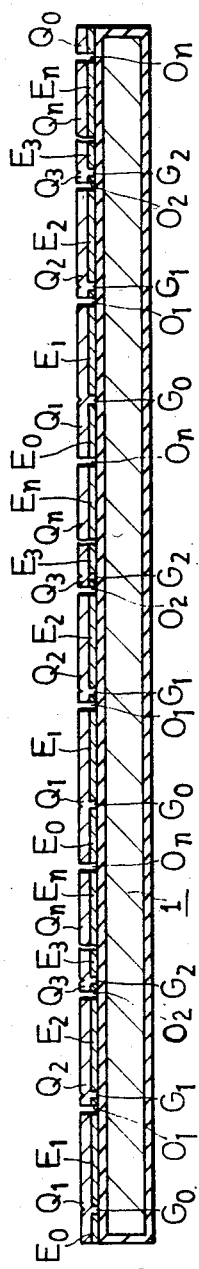

In another embodiment of the present invention, however, a plurality a×b of such photoelectric conversion devices, each made up of the n semiconductor elements $U_1$ to $U_n$ connected in series as shown in FIGS. 1 and 2, are arranged in the form of a matrix consisting of a rows and b columns as illustrated in FIGS. 13 and 14 corresponding to FIGS. 1 and 2. In FIGS. 13 and 14 reference character $M_{rs}$ (r=1, 2, ... a and s=1, 2, ... b) indicates each photoelectric conversion device disposed at one of the intersections of rows and columns. The photoelectric conversion devices $M_{11}$ to $M_{1b}$, $M_{21}$ to $M_{2b}$, ... and $M_{a1}$ to $M_{ab}$ are isolated by grooves 26 from adjacent ones of them.

In the embodiment illustrated in FIGS. 13 and 14, the photoelectric conversion device $M_{rs}$ is identical in construction with the photoelectric conversion device of the embodiment of FIGS. 1 to 3 except in the following points:

An electrode $E_0$ similar to the electrodes $E_1$ to $E_n$ is formed on the substrate 1 on the side of the electrode $E_1$ of the semiconductor element $U_1$ on the opposite side from the electrode $E_1$ and the electrode $E_0$ is isolated by a groove $G_0$ similar to $G_1$ to $G_{n-1}$.

Further, the non-single-crystal semiconductor laminate member $Q_1$ of the semiconductor element $U_1$ does not extend from the electrode $E_1$ to the substrate surface but instead it extends across the groove $G_0$ to the marginal edge of the electrode $E_0$.

The electrode $F_1$ of the semiconductor element $U_1$, which is formed to cover the non-single-crystal semiconductor laminate member $Q_1$ and extend to the substrate 1 in the first embodiment, is formed to extend to the marginal edge of the non-single-crystal semiconductor laminate member $Q_1$ correspondingly. And the external connection terminal 11 is formed by the end portion of the electrode $F_1$ on the non-single-crystal semiconductor laminate member $Q_1$ on the opposite side from the electrode $F_2$.

Moreover, as shown in FIG. 11, the non-single-crystal semiconductor laminate member $Q_n$ of the semiconductor element $U_n$ is formed to extend to the marginal edge of the electrode $E_n$.

The electrode $F_0$, though formed to cover the non-single-crystal semiconductor laminate member $Q_n$ and to extend to the substrate 1 in the embodiment of FIGS. 1 to 3, extends to the marginal edge of the non-single-crystal semiconductor laminate member $Q_n$ correspondingly. And the external connection terminal 12 is formed by the end portion of the electrode $F_0$ on the non-single-crystal semiconductor laminate member $Q_n$ on the opposite side from the electrode $F_n$.

The above is a description of the abovesaid another embodiment of the photoelectric conversion device of the present invention.

The photoelectric conversion device of such a construction can be obtained by a manufacturing method similar to that employed for the fabrication of the photoelectric conversion device of the embodiment of FIGS. 1 to 3.

That is, as shown in FIGS. 15A to 15G corresponding to FIGS. 4A to 4G, $a \times b$ photoelectric conversion devices $M_{11}$ to $M_{1b}$, $M_{21}$ to $M_{2b}$, ... and $M_{a1}$ to $M_{ab}$ are formed on the substrate 1 by a sequence of steps similar to those shown in FIGS. 4A to 4G, though not described in detail.

Next, as shown in FIG. 15H, the grooves 26 are formed by the same laser beam scanning as described previously with respect to FIG. 4.

Next, the light transparent antireflection and protective film 15 (not shown) is formed.

In this way, the structure of the embodiment referred to previously in conjunction with FIGS. 13 and 14 is obtained.

The above is a description of the abovesaid another embodiment and its manufacturing method.

The photoelectric conversion device of FIGS. 13 and 14 is identical in construction with the embodiment of FIGS. 1 to 3 except in the abovesaid points, and hence presents the same advantages as those obtainable with the embodiment of FIGS. 1 to 3, though not described in detail.

Moreover, according to the embodiment of FIGS. 13 and 14, the photoelectric conversion devices $M_{11}$ to $M_{1b}$, $M_{21}$ to $M_{2b}$, ... and $M_{a1}$ to $M_{ab}$ are formed on the substrate 1 and separated by the grooves 26 and the substrate 1 is formed by the insulating sheet-like member, so that it can easily be severed at the positions of the grooves 26 into $a \times b$ independent photoelectric conversion devices.

Incidentally, the embodiment of FIGS. 13 and 14 can also be modified and varied in the same manner as in the embodiments of FIGS. 5 to 12 which are modifications and variations of the embodiment of FIGS. 1 to 3.

It will be apparent that may modifications and variations may be effected without departing from the scope of the novel concepts of the present invention.

What is claimed is:

1. A method of making a photoelectric conversion device, comprising the steps of:

preparing a substrate formed by an insulating sheet-like member having a metallic sheet-like member and an insulating film having a thermal conductivity less than that of glass formed on the metallic sheet-like member;

forming a first conductive layer on the insulating film of the substrate;

forming $n-1$ (where n is an integer larger than 2) sequentially arranged first grooves $G_1$ to $G_{n-1}$ in the first conductive layer by using a first laser beam to form n sequentially arranged first electrodes $E_1$ to $E_n$ separated by the first grooves $G_1$ to $G_{n-1}$, respectively;

forming on the substrate a non-single-crystal semiconductor laminate layer having formed therein at least one semiconductor junction to cover the first grooves $G_1$ to $G_{n-1}$ and the first electrodes $E_1$ to $E_n$;

forming $n-1$ sequentially arranged second grooves $O_1$ to $O_{n-1}$ in the non-single-crystal semiconductor laminate layer by using a second laser beam to form n sequentially arranged non-single-crystal semiconductor laminate members $Q_1$ to $Q_n$ defined by the second grooves $O_1$ to $O_{n-1}$, respectively, thereby to expose portions of the respective first electrodes $E_1$ to $E_{n-1}$ to the outside, where the grooves $O_1$ to $O_{n-1}$ do not extend to the metallic sheet-like member of the substrate due to the low thermal conductivity of the insulating film;

forming a second conductive layer which continuously extends on the non-single-crystal semiconductor laminate members $Q_1$ to $Q_n$ and extends into the grooves $O_1$ to $O_{n-1}$ to provide coupling portions $K_1$ to $K_{n-1}$ which are connected to the first electrodes $E_1$ to $E_{n-1}$ through the grooves $O_1$ to $O_{n-1}$, respectively, and;

forming $n-1$ sequentially arranged isolating portions $H_1$ to $H_{n-1}$ in the second conductive layer on the non-single-crystal semiconductor laminate members $Q_1$ to $Q_{n-1}$, respectively, to form n sequentially arranged second electrodes $F_1$ to $F_n$ which are isolated by the isolating portions $H_1$ to $H_{n-1}$, respectively, and opposite the first electrodes $E_1$ to $E_n$ through the non-single-crystal semiconductor laminate members $Q_1$ to $Q_n$, respectively, the second electrode $F_{j+1}$ (j=1, 2, 3, ... (n−1) being connected to the first electrode $E_j$ through the coupling portion $K_j$.

2. A method of making a photoelectric conversion device according to claim 1, wherein the formation of the grooves $G_1$ to $G_{n-1}$ is carried out in the air.

3. A method of making a photoelectric conversion device according to claim 1, wherein the formation of the groove $G_1$ to $G_{n-1}$ is carried out in an atmosphere of a gas or a liquid which reacts with the material of the first conductive layer at high temperature to spatter it from the surface of the substrate.

4. A method of making a photoelectric conversion device according to claim 3, wherein the gas is hydrogen fluoride, hydrogen chloride, or a Freon gas, and wherein the liquid is hydrofluoric acid, hydrochloric acid, or a Freon liquid.

5. A method of making a photoelectric conversion device according to claim 1, wherein the second groove $O_j$ ($j=1, 2, \ldots (n-1)$) is formed a predetermined distance apart from the first groove $G_j$ but adjacent thereto, and wherein the isolating portion $H_j$ is formed a predetermined distance apart from the first groove $G_j$ and the second groove $O_j$ and adjacent to the second groove $O_j$.

6. A method of making a photoelectric conversion device according to claim 1, wherein the second groove $O_j$ ($j=1, 2, \ldots (n-1)$) is formed to extend through the first electrode $E_j$ so that the coupling portion $K_j$ may be connected with the side of the first electrode $E_j$ which is exposed by the second groove $O_j$.

7. A method of making a photoelectric conversion device according to claim 1, wherein the formation of the grooves $O_1$ to $O_{n-1}$ is carried out in the air.

8. A method of making a photoelectric conversion device according to claim 1, wherein the formation of the grooves $O_1$ to $O_{n-1}$ is carried out in an atmosphere of a gas or a liquid which reacts with the material of the non-single-crystal semiconductor laminate member at high temperature to spatter it from the surface of the substrate.

9. A method of making a photoelectric conversion device according to claim 8, wherein the gas is hydrogen fluoride, hydrogen chloride, or a Freon gas, and wherein the liquid is hydrofluoric acid, hydrochloric acid, or a Freon liquid.

10. A method of making a photoelectric conversion device according to claim 1, wherein the formation of the isolating portions $H_1$ to $H_{n-1}$ is carried out in the air.

11. A method of making a photoelectric conversion device according to claim 1, wherein the formation of the isolating $H_1$ to $H_{n-1}$ is carried out in an atmosphere of a gas or a liquid which reacts with the material of the second conductive layer at high temperature to spatter it from the surface of the substrate.

12. A method of making a photoelectric conversion device according to claim 11, wherein the gas is hydrogen fluoride, hydrogen chloride, or a Freon gas, and wherein the liquid is hydrofluoric acid, hydrochloric acid, or a Freon liquid.

13. A method of making a photoelectric conversion device according to claim 1, wherein the formation of the isolating portions $H_1$ to $H_{n-1}$ is carried out in an atmosphere of oxygen.

14. A method of making a photoelectric conversion device according to claim 1, wherein the formation of the isolating portions $H_1$ to $H_{n-1}$ is carried out so that the isolating portion $H_j$ may extend into the non-single-crystal semiconductor laminate member $Q_j$.

15. A method of making a photoelectric conversion device according to claim 1 where the thickness of said insulating film is 0.1 to 5 um.

16. A method of making a photoelectric conversion device according to claim 1 wherein said insulating film comprises an organic resinous material having a melting point less than that of glass.

17. A method of making a photoelectric conversion device according to claim 16 where said organic resinous material is selected from the group consisting of polyethylene terephthalate resins, polyimide resins, polyether sulfone resins, and polyether ketone resins.

18. A method of making a photoelectric conversion device according to claim 17 where said organic resinous material is a polyimide resin.

* * * * *